US012575268B2

(12) United States Patent
Oh et al.

(10) Patent No.: US 12,575,268 B2
(45) Date of Patent: Mar. 10, 2026

(54) DISPLAY DEVICE AND METHOD OF MANUFACTURING THE SAME

(71) Applicant: Samsung Display Co., Ltd., Yongin-si (KR)

(72) Inventors: Eon Seok Oh, Seongnam-si (KR); Jungjoon Seo, Yongin-si (KR); Taehyun Sung, Uiwang-si (KR); Seungsoo Hong, Bucheon-si (KR); Sangyeol Kim, Gwacheon-si (KR); Je-Hyun Song, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 411 days.

(21) Appl. No.: 18/115,174

(22) Filed: Feb. 28, 2023

(65) Prior Publication Data

US 2023/0413610 A1    Dec. 21, 2023

(30) Foreign Application Priority Data

May 27, 2022    (KR) ......................... 10-2022-0065371

(51) Int. Cl.
H10K 59/122 (2023.01)
H10K 59/12 (2023.01)
H10K 59/131 (2023.01)
H10K 59/80 (2023.01)
H10K 71/40 (2023.01)

(52) U.S. Cl.
CPC ....... H10K 59/122 (2023.02); H10K 59/1201 (2023.02); H10K 59/131 (2023.02); H10K 59/8792 (2023.02); H10K 71/421 (2023.02)

(58) Field of Classification Search
CPC ............... H10K 50/865; H10K 50/822; H10K 59/80521; H10K 71/621; H10K 71/60
See application file for complete search history.

(56) References Cited

U.S. PATENT DOCUMENTS

| | | | | |
|---|---|---|---|---|
| 2021/0305343 A1* | 9/2021 | Oh | ........................ | H10K 71/621 |
| 2022/0045155 A1* | 2/2022 | Ma | ........................ | G09G 3/3233 |
| 2022/0199731 A1* | 6/2022 | Jeong | ................... | H10K 59/126 |

FOREIGN PATENT DOCUMENTS

| | | | | |
|---|---|---|---|---|
| CN | 113327934 A | * 8/2021 | ............ | B23K 26/36 |
| KR | 1020210121372 A | 10/2021 | | |
| KR | 1020220001800 A | 1/2022 | | |
| KR | 1020220003940 A | 1/2022 | | |
| KR | 1020220154313 A | 11/2022 | | |

* cited by examiner

*Primary Examiner* — Alia Sabur

(74) *Attorney, Agent, or Firm* — CANTOR COLBURN LLP

(57) ABSTRACT

A display device in an embodiment includes a base substrate including a first auxiliary display area and a main display area surrounding a first auxiliary display area, a pixel circuit layer disposed on a base substrate, and a light-emitting device layer disposed on a pixel circuit layer and including a plurality of first light-emitting devices disposed in the first auxiliary display area, and each of a plurality of first light-emitting devices includes a pixel electrode, a light-emitting layer disposed on a pixel electrode, and a common electrode disposed on a light-emitting layer and defining a plurality of transmission holes defined in the first auxiliary display area, and a plurality of first light-emitting devices and a plurality of transmission holes are alternately arranged in a plan view.

19 Claims, 16 Drawing Sheets

DISPLAY DEVICE AND METHOD OF MANUFACTURING THE SAME

This application claims priority to Korean Patent Application No. 10-2022-0065371, filed on May 27, 2022, and all the benefits accruing therefrom under 35 U.S.C. § 119, the content of which in its entirety is herein incorporated by reference.

BACKGROUND

1. Field

Embodiments of the invention relate to display device and method of manufacturing the display device.

2. Description of the Related Art

The display device may display an image using pixels. The display device may include an area that transmits an external input and/or an internal output. In such a display device, a method for improving the transmittance of the area is being studied.

SUMMARY

Embodiments provide a display device having improved transmittance and improved reliability in a partial area.

Embodiments provide a method of manufacturing the display device.

A display device in an embodiment may include a base substrate including a first auxiliary display area and a main display area surrounding the first auxiliary display area, a pixel circuit layer disposed on the base substrate, and a light-emitting device layer disposed on the pixel circuit layer and including a plurality of first light-emitting devices disposed in the first auxiliary display area, and each of the plurality of first light-emitting devices may include a pixel electrode, a light-emitting layer disposed on the pixel electrode, and a common electrode disposed on the light-emitting layer and defining a plurality of transmission holes defined in the first auxiliary display area, and the plurality of first light-emitting devices and the plurality of transmission holes may be alternately arranged in a plan view.

In an embodiment, the light-emitting device layer may further include a pixel defining pattern exposing a portion of the pixel electrode, and the plurality of transmission holes may be spaced apart from the pixel defining pattern in the plan view.

In an embodiment, the plurality of transmission holes may be repeatedly arranged along a row direction and a column direction in the plan view.

In an embodiment, the plurality of transmission holes may include a plurality of first transmission holes having a first planar shape, and a plurality of second transmission holes having a second planar shape different from the first planar shape.

In an embodiment, the plurality of first transmission holes may be repeatedly arranged in odd rows of the first auxiliary display area in the plan view, and the plurality of second transmission holes may be arranged in even rows of the first auxiliary display area in the plan view.

In an embodiment, at least one of inner surfaces of the common electrode exposed by the plurality of transmission holes may include a plurality of curves.

In an embodiment, the base substrate may further include a second auxiliary display area adjacent to the first auxiliary display area, and the light-emitting device layer may further include a plurality of second light-emitting devices disposed in the second auxiliary display area, and the pixel circuit layer may include a first pixel circuit which is disposed in the second auxiliary display area and controls a current transmitted to at least one of the plurality of first light-emitting devices, and a second pixel circuit which is disposed in the second auxiliary display area and controls a current transmitted to at least one of the plurality of second light-emitting devices.

In an embodiment, the pixel circuit layer may further include a connection line electrically connecting at least one of the plurality of first light-emitting devices and the first pixel circuit.

In an embodiment, the connection line may include a transparent conductive oxide.

In an embodiment, a transmittance of the first auxiliary display area may be higher than a transmittance of the second auxiliary display area and a transmittance of the main display area.

In an embodiment, the display device may further include a light-blocking pattern disposed between the base substrate and the light-emitting device layer, and the light-blocking pattern may overlap the plurality of first light-emitting devices in the plan view.

In an embodiment, the light-blocking pattern may cover an entire lower surface of the pixel electrode included in each of the plurality of first light-emitting devices.

In an embodiment, the light-blocking pattern may be spaced apart from the plurality of transmission holes in the plan view.

In an embodiment, the light-blocking pattern may include a metal material, and the metal material may absorb or reflect an incident infrared laser.

In an embodiment, a thickness of the light-blocking pattern may be about 50 nanometers (nm) to about 500 nm.

In an embodiment, the display device may further include an electronic module disposed under the base substrate and overlapping the first auxiliary display area on a plan.

A method of manufacturing the display device in an embodiment may include preparing a base substrate including a first auxiliary display area and a main display area surrounding the first auxiliary display area, forming a pixel circuit layer on the base substrate, forming a plurality of first light-emitting devices disposed in the first auxiliary display area on the pixel circuit layer, and irradiating a laser to the first auxiliary display area from a lower side of the base substrate, and each of the plurality of first light-emitting devices may include a pixel electrode, a light-emitting layer disposed on the pixel electrode, and a common electrode disposed on the light-emitting layer, and in the irradiating the laser, a plurality of transmission holes may be defined in the common electrode to be alternately arranged with the plurality of first light-emitting devices in a plan view.

In an embodiment, the irradiating the laser may be defining the plurality of transmission holes by irradiating the laser in a dot shape.

In an embodiment, the method may further include forming a light-blocking pattern on the base substrate, and the light-blocking pattern may overlap the plurality of first light-emitting devices.

Therefore, the display device in embodiments of the invention may include a plurality of first light-emitting devices. The plurality of first light-emitting devices may be disposed in a first auxiliary display area. A plurality of transmission holes may be defined in the common electrode disposed in the first auxiliary display area. In the first auxiliary display area, the plurality of first light-emitting devices and the plurality of transmission holes may be alternately arranged. Accordingly, the transmittance of the first auxiliary display area may be improved.

In addition, the plurality of transmission holes may be defined by selectively removing a portion irradiated with a laser. The laser may be irradiated in the form of dots for each region between the plurality of first light-emitting devices. Accordingly, in the process of defining the plurality of transmission holes, a damage of the plurality of first light-emitting devices, the pixel defining pattern, and the plurality of insulating layers disposed in the first auxiliary display area may be minimized. Accordingly, the reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIGS. 10 to 15 are cross-sectional views illustrating a method of manufacturing a display panel included in the display device of FIG. 1.

DETAILED DESCRIPTION

Figure 1:
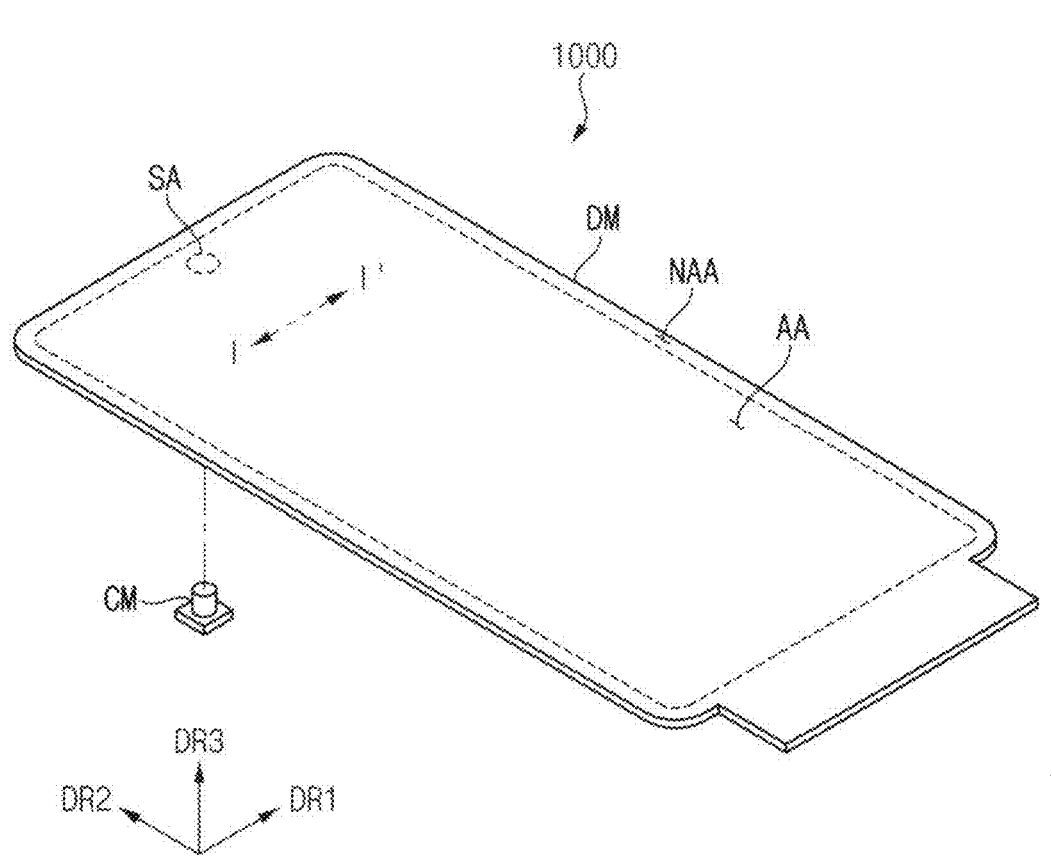
FIG. 1 is a diagram illustrating an embodiment of a display device.

Illustrative, non-limiting embodiments will be more clearly understood from the following detailed description in conjunction with the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a diagram illustrating an embodiment of a display device.

Referring to FIG. 1, a display device 1000 in an embodiment may include a display module DM and an electronic module CM. The display module DM may generate an image and sense externally applied pressure. The electronic module CM may be disposed below the display module DM.

An active area AA and a non-active area NAA may be defined in the display module DM. The display device 1000 may display an image through the active area AA of the display module DM. The active area AA may include a plane defined by a first direction DR1 and a second direction DR2 orthogonal to the first direction DR1. That is, the display device 1000 may display an image in the third direction DR3 perpendicular to the plane through the active area AA of the display module DM. The non-active area NAA may be disposed around the active area AA. In an embodiment, the non-active area NAA may surround the active area AA, for example.

In an embodiment, the sensing area SA may be defined in the active area AA. In an embodiment, the sensing area SA may be a portion of the active area AA, for example. That is, the sensing area SA may display an image, and may transmit an external input provided to the electronic module CM and/or an output provided from the electronic module CM. The sensing area SA may have a higher transmittance than those of other areas in the active area AA. Although FIG. 1 illustrates that one sensing area SA is defined in the active area AA, the number of sensing area SA is not necessarily limited thereto.

The electronic module CM may be disposed in an area overlapping the sensing area SA. As described above, the electronic module CM may receive an external input transmitted through the sensing area SA or may provide an output to the outside through the sensing area SA. In an embodiment, the electronic module CM may be a camera module, a sensor for measuring a distance, a sensor for recognizing a part of the user's body, a small lamp outputting light, etc., for example, but the type of the electronic module CM is not limited thereto.

Figure 2:
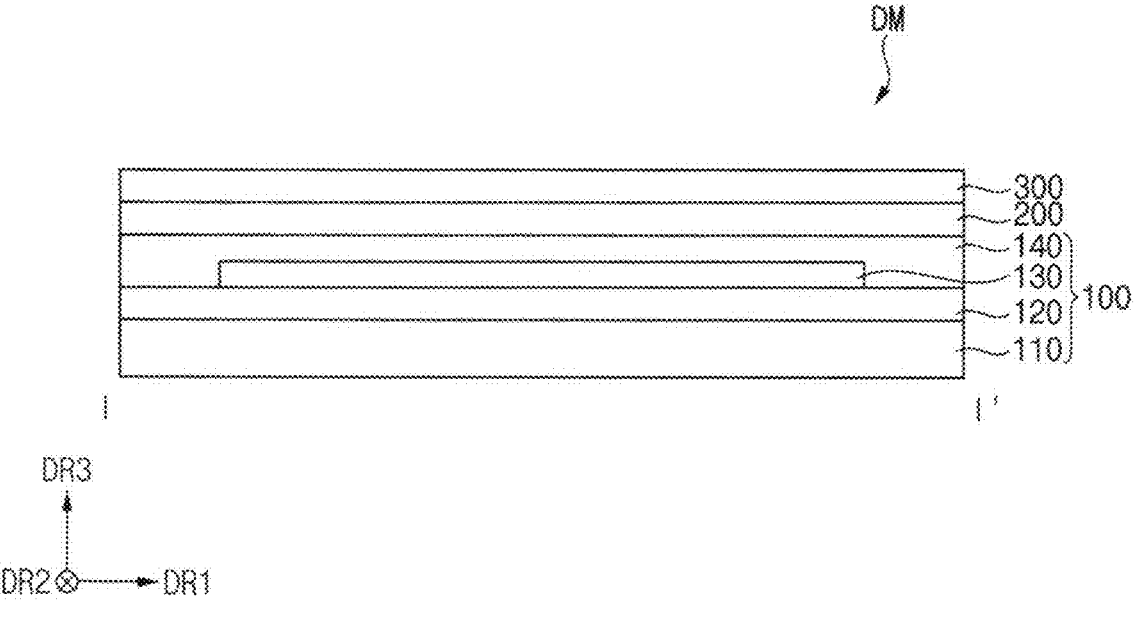
FIG. 2 is a cross-sectional view illustrating a display module included in the display device of FIG. 1.

FIG. 2 is a cross-sectional view illustrating a display module included in the display device of FIG. 1. In an embodiment, FIG. 2 is a cross-sectional view taken along line I-I' of FIG. 1, for example.

Referring to FIGS. 1 and 2, the display module DM may include a display panel 100, a sensing layer 200, and an anti-reflection layer 300. The display panel 100 may include a base substrate 110, a pixel circuit layer 120, a light-emitting device layer 130, and an encapsulation layer 140.

The display panel 100 may substantially generate an image. In an embodiment, the display panel 100 may be an organic light-emitting display panel, an inorganic light-emitting display panel, or a quantum dot display panel, for example. Hereinafter, a case in which the display panel 100 is an organic light-emitting display panel will be limitedly described, but the configuration of the invention is not necessarily limited thereto.

The base substrate 110 may be an insulating substrate including a transparent or opaque material. The base substrate 110 may have a single-layer or multi-layer structure. In an embodiment, the base substrate 110 may include glass. In this case, the base substrate 110 may be a rigid substrate. In another embodiment, the base substrate 110 may include plastic. In this case, the base substrate 110 may be a flexible substrate. In an embodiment, plastics that may be used for the base substrate 110 may include polyimide ("PI"), poly-ethylene terephthalate ("PET"), polyethylene naphthalene ("PEN"), polypropylene ("PP"), and polycarbonate ("PC"), polystyrene ("PS"), polysulfone ("PSul"), polyethylene ("PE"), polyphthalamide ("PPA"), polyethersulfone ("PES"), polyarylate ("PAR"), polycarbonate oxide ("PCO"), modified polyphenylene oxide ("MPPO"), or the like. These may be used alone or in combination with each other.

The pixel circuit layer 120 may be disposed on the base substrate 110. The pixel circuit layer 120 may include an inorganic layer, an organic layer, and a metal pattern. A pixel circuit may be implemented through the inorganic layer, the organic layer, and the metal pattern.

The light-emitting device layer 130 may be disposed on the pixel circuit layer 120. The light-emitting device layer 130 may include a plurality of light-emitting devices. In an embodiment, the light-emitting device layer 130 may include an organic light-emitting material, an inorganic light-emitting material, an organic-inorganic light-emitting material, quantum dots, or the like, for example. Hereinafter, a case in which the light-emitting device layer 130 includes an organic light-emitting material will be limitedly described, but the configuration of the invention is not necessarily limited thereto.

The encapsulation layer 140 may be disposed on the light-emitting device layer 130. The encapsulation layer 140 may include at least one inorganic encapsulation layer and at least one organic encapsulation layer. In an embodiment, the encapsulation layer 140 may include a first inorganic encapsulation layer disposed on the light-emitting device layer 130, an organic encapsulation layer disposed on the first inorganic encapsulation layer, and a second encapsula-tion layer disposed on the organic encapsulation layer, for example. The encapsulation layer 140 may prevent mois-ture, air, etc. from penetrating into the light-emitting device layer 130.

The sensing layer 200 may be disposed on the display panel 100. In other words, the sensing layer 200 may be disposed on the encapsulation layer 140. The sensing layer 200 may sense an external input applied from the outside. In an embodiment, the external input may be a user's touch, for example. In an embodiment, the sensing layer 200 may be formed on the display panel 100 through a continuous process. In this case, an additional component (e.g., an adhesive member) may not be disposed between the display panel 100 and the sensing layer 200. In another embodiment, the display panel 100 and the sensing layer 200 may be bonded to each other through an adhesive member.

The anti-reflection layer 300 may be disposed on the sensing layer 200. The anti-reflection layer 300 may sup-press reflection of external light incident from the outside of the display module DM. In an embodiment, the anti-reflec-tion layer 300 may include a phase retarder and a polarizer. The phase retarder and the polarizer may be implemented as a single polarizing film. In another embodiment, the anti-reflection layer 300 may include color filters. The color filters may have a predetermined arrangement. In an embodiment, the color filters may be arranged in consider-ation of colors emitted by pixels included in the display panel 100, for example.

In an embodiment, the sensing layer 200 may be omitted. When the sensing layer 200 is omitted, the anti-reflection layer 300 may be disposed on the display panel 100. In an embodiment, the anti-reflection layer 300 may be formed on the display panel 100 through a continuous process, for example. Also, the positions of the sensing layer 200 and the anti-reflection layer 300 may be different from each other. In an embodiment, the anti-reflection layer 300 may be dis-posed between the display panel 100 and the sensing layer 200, for example.

Figure 3:
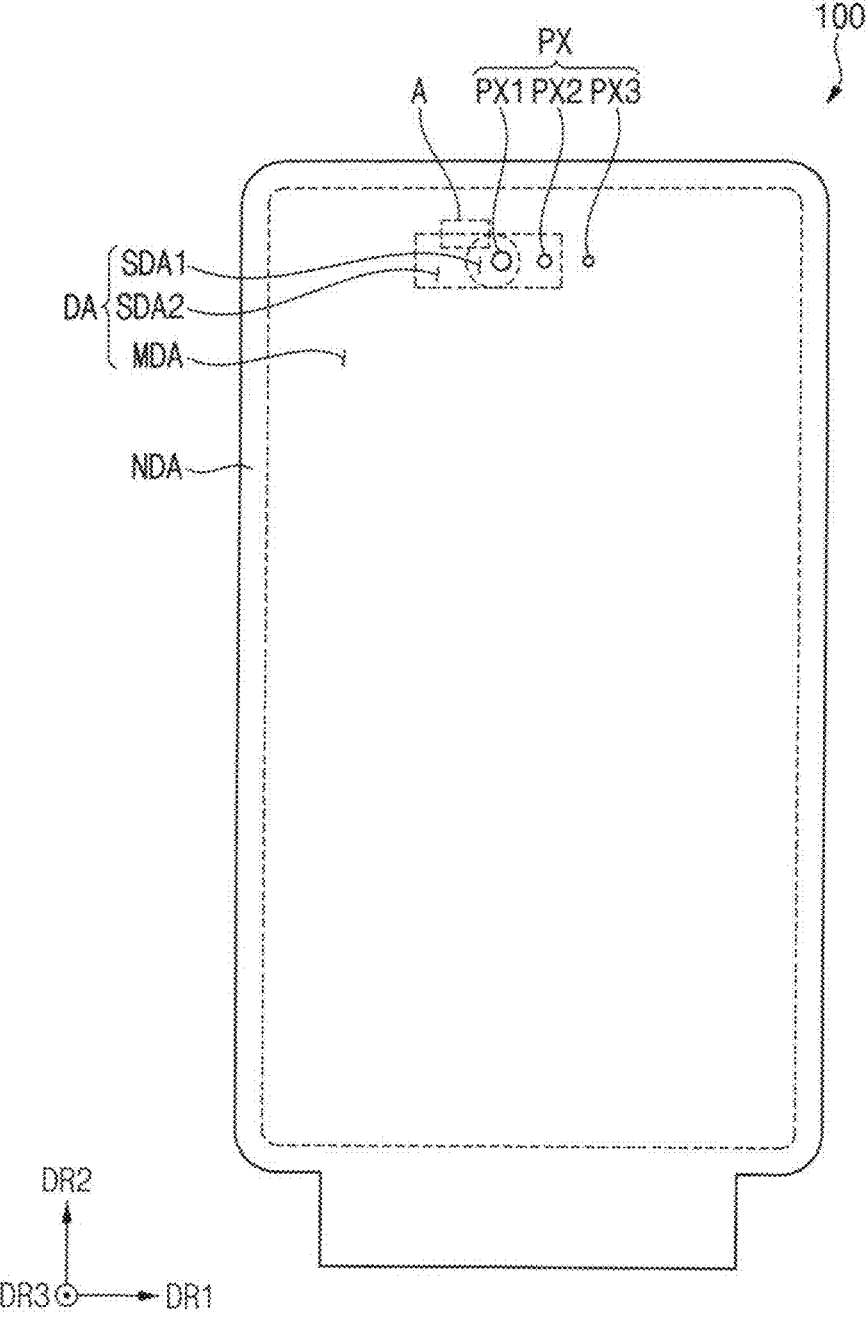
FIG. 3 is a plan view illustrating a display panel included in the display module of FIG. 2.
Figure 4:
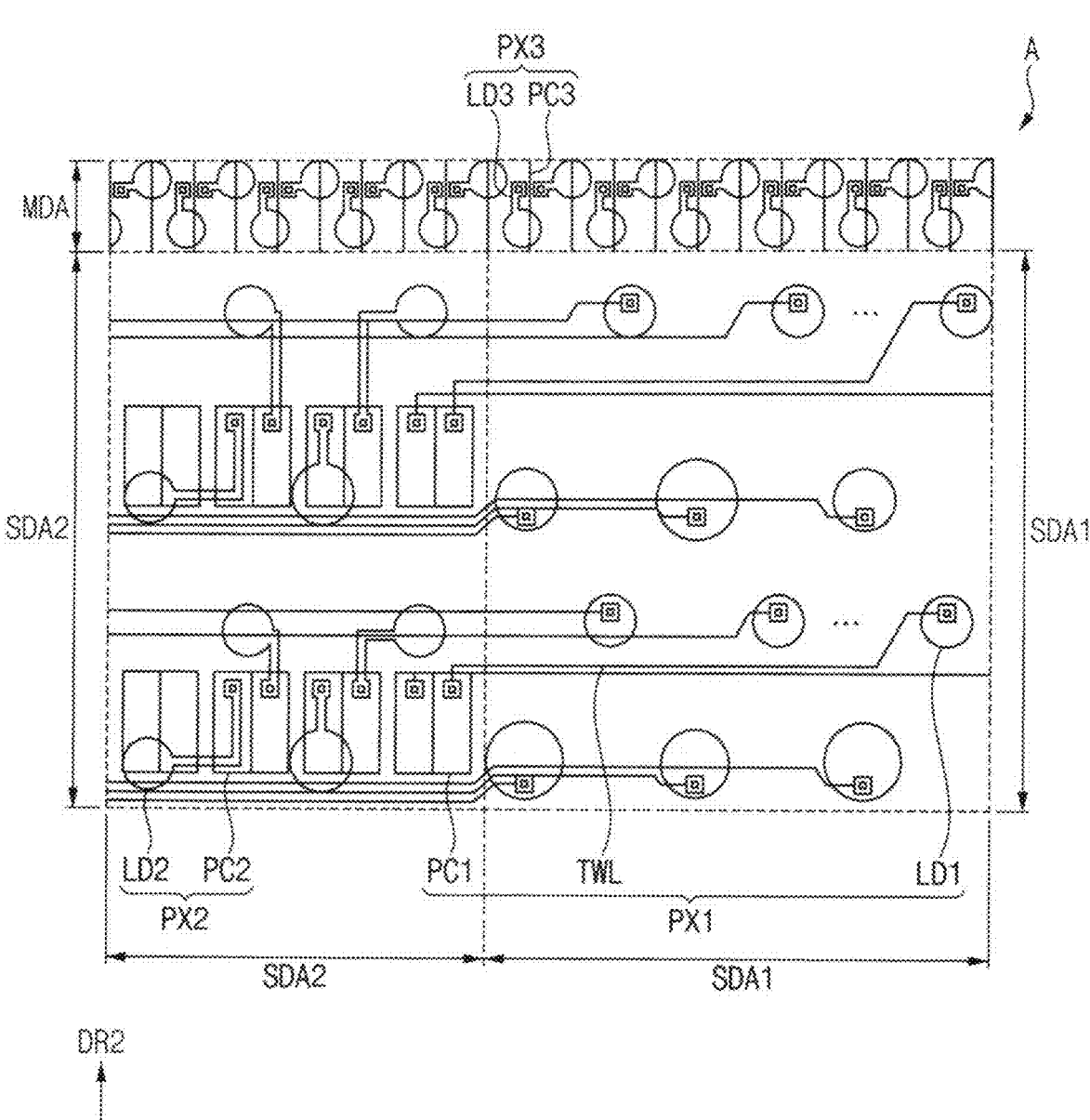
FIG. 4 is an enlarged view illustrating an enlarged area 'A' of FIG. 3.

FIG. 3 is a plan view illustrating a display panel included in the display module of FIG. 2. FIG. 4 is an enlarged view illustrating an enlarged area 'A' of FIG. 3.

Referring to FIGS. 3 and 4, the display panel 100 may include a display area DA and a non-display area NDA. The display area DA may correspond to the active area AA of FIG. 1. The non-display area NDA may correspond to the non-active area NAA of FIG. 1. The non-display area NDA may be disposed around the display area DA. In an embodiment, the non-display area NDA may surround the display area DA, for example.

The display area DA may include a first auxiliary display area SDA1, a second auxiliary display area SDA2, and a main display area MDA. The first auxiliary display area SDA1 may be also referred to as a component area. The second auxiliary display area SDA2 may be also referred to as an intermediate area or a transient area. The main display area MDA may be also referred to as a general display area.

The first auxiliary display area SDA1 may overlap or correspond to the sensing area SA shown in FIG. 1. In other words, the first auxiliary display area SDA1 may overlap the electronic module CM of FIG. 1 in a plan view. In an embodiment, an external input may be provided to the electronic module CM through the first auxiliary display area SDA1, and an output from the electronic module CM may be emitted to the outside through the first auxiliary display area SDA1, for example. Although FIG. 3 illustrates that the first auxiliary display area SDA1 has a circular shape, the configuration of the invention is not limited thereto. In an embodiment, the first auxiliary display area SDA1 may have various shapes, such as a polygonal shape, an elliptical shape, or an irregular shape, for example.

The second auxiliary display area SDA2 may be adjacent to the first auxiliary display area SDA1. In an embodiment, the second auxiliary display area SDA2 may surround the first auxiliary display area SDA1, for example. In an embodiment, a transmittance of the second auxiliary display area SDA2 may be lower than a transmittance of the first auxiliary display area SDA1. In an embodiment, the second auxiliary display area SDA2 may be spaced apart from the non-display area NDA. However, the invention is not limited thereto, and in another embodiment, the second auxiliary display area SDA2 may contact the non-display area NDA.

The main display area MDA may be adjacent to the second auxiliary display area SDA2. In an embodiment, a transmittance of the main display area MDA may be lower than the transmittance of the first auxiliary display area SDA1.

The display panel 100 may include a plurality of pixels PX. The plurality of pixels PX may be disposed in the display area DA. The plurality of pixels PX may include a first pixel PX1, a second pixel PX2, and a third pixel PX3. The first pixel PX1 may emit light in the first auxiliary display area SDA1, the second pixel PX2 may emit light in the second auxiliary display area SDA2, and the third pixel PX3 may emit light in the main display area MDA.

Each of the first pixel PX1, the second pixel PX2, and the third pixel PX3 may be provided in plural. In this case, each of the plurality of first to third pixels PX1, PX2, and PX3 may include a red pixel, a green pixel, and a blue pixel. In an embodiment, each of the plurality of first to third pixels PX1, PX2, and PX3 may further include a white pixel.

The first pixel PX1 may include a first light-emitting device LD1 and a first pixel circuit PC1. The first pixel circuit PC1 may control the current transmitted to the first light-emitting device LD1. The second pixel PX2 may include a second light-emitting device LD2 and a second pixel circuit PC2. The second pixel circuit PC2 may control the current transmitted to the second light-emitting device LD2. The third pixel PX3 may include a third light-emitting device LD3 and a third pixel circuit PC3. The third pixel circuit PC3 may control the current transmitted to the third light-emitting device LD3.

In an embodiment, the first light-emitting device LD1 may be disposed in the first auxiliary display area SDA1, and the first pixel circuit PC1 may be disposed in the second auxiliary display area SDA2. In another embodiment, the first light-emitting device LD1 may be disposed in the non-display area NDA. As the first pixel circuit PC1 is not disposed in the first auxiliary display area SDA1, the transmittance of the first auxiliary display area SDA1 may be improved.

In this case, the first light-emitting device LD1 and the first pixel circuit PC1 may be electrically connected to each other through the connection line TWL. The connection line TWL may include a transparent conductive material. In an embodiment, the connection wiring TWL may include a transparent conductive oxide ("TCO") such as indium tin oxide ("ITO"), indium zinc oxide ("IZO"), indium gallium zinc oxide ("IGZO"), zinc oxide (ZnO), or indium oxide (In2O3).

Specifically, the first light-emitting device LD1 may be disposed in the first auxiliary display area SDA1, and the first pixel circuit PC1, the second light-emitting device LD2, and the second pixel circuit PC2 may be disposed in the second auxiliary display area SDA2, and the third light-emitting device LD3 and the third pixel circuit PC3 may be disposed in the main display area MDA.

Accordingly, the transmittance of the second auxiliary display area SDA2 and the transmittance of the main display area MDA may be lower than the transmittance of the first auxiliary display area SDA1. In addition, as the first pixel circuit PC1 is disposed in the second auxiliary display area SDA2, the number of second pixels PX2 disposed in the second auxiliary display area SDA2 may be less than the number of the third pixels PX3 disposed in the main display area MDA within a unit area.

In an embodiment, each of the first light-emitting device LD1, the second light-emitting device LD2, and the third light-emitting device LD3 may be provided in plural. A distance between two first light-emitting devices most adjacent to each other among the plurality of first light-emitting devices LD1 may be greater than a distance between two third light-emitting devices most adjacent to each other among the plurality of third light-emitting devices LD3. Also, a distance between two second light-emitting devices most adjacent to each other among the plurality of second light-emitting devices LD2 may be greater than the distance between two third light-emitting devices most adjacent to each other among the plurality of third light-emitting devices LD3.

Figure 5:
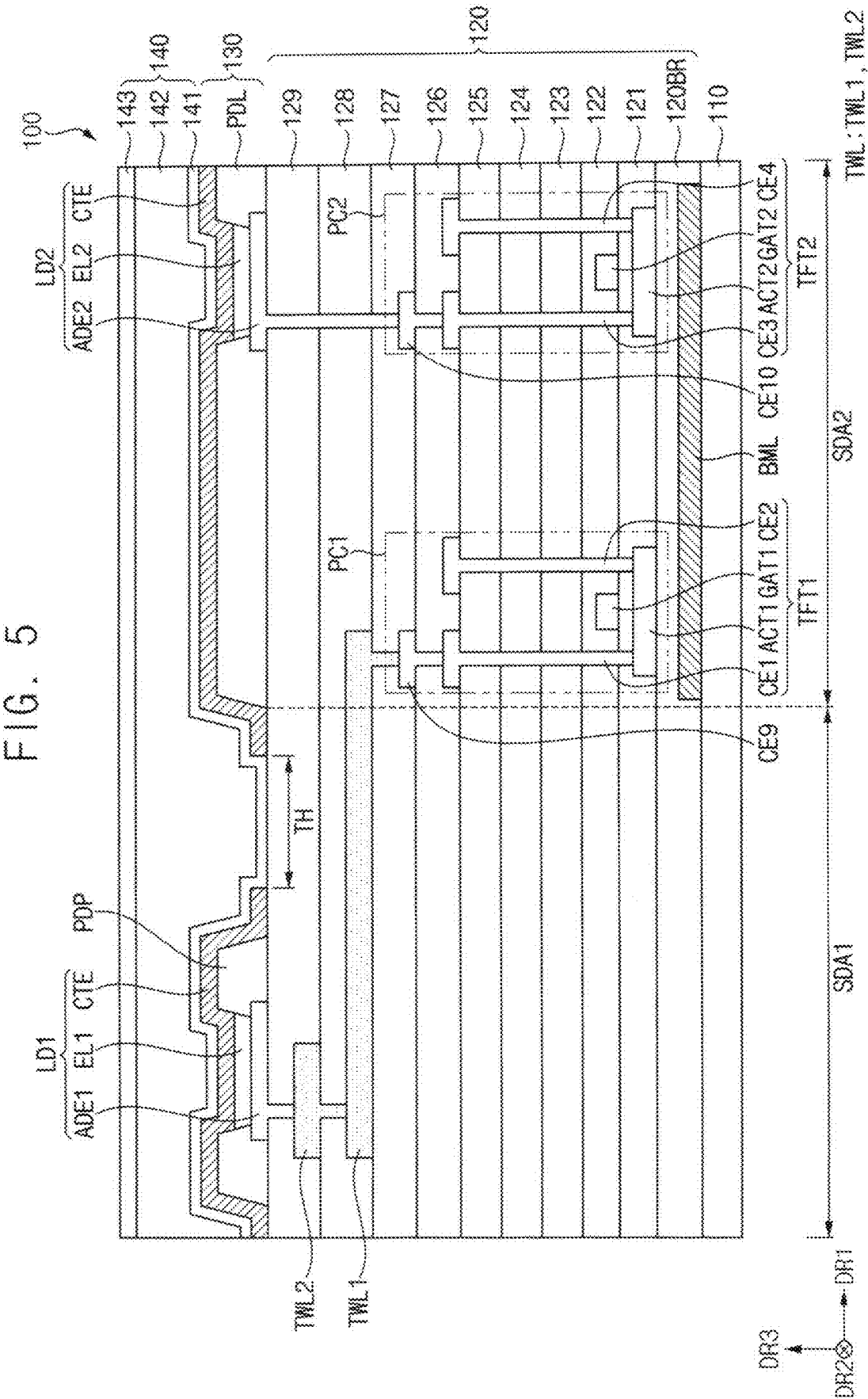
FIG. 5 is a cross-sectional view illustrating a first auxiliary display area and a second auxiliary display area of the display panel of FIG. 3.
Figure 6:
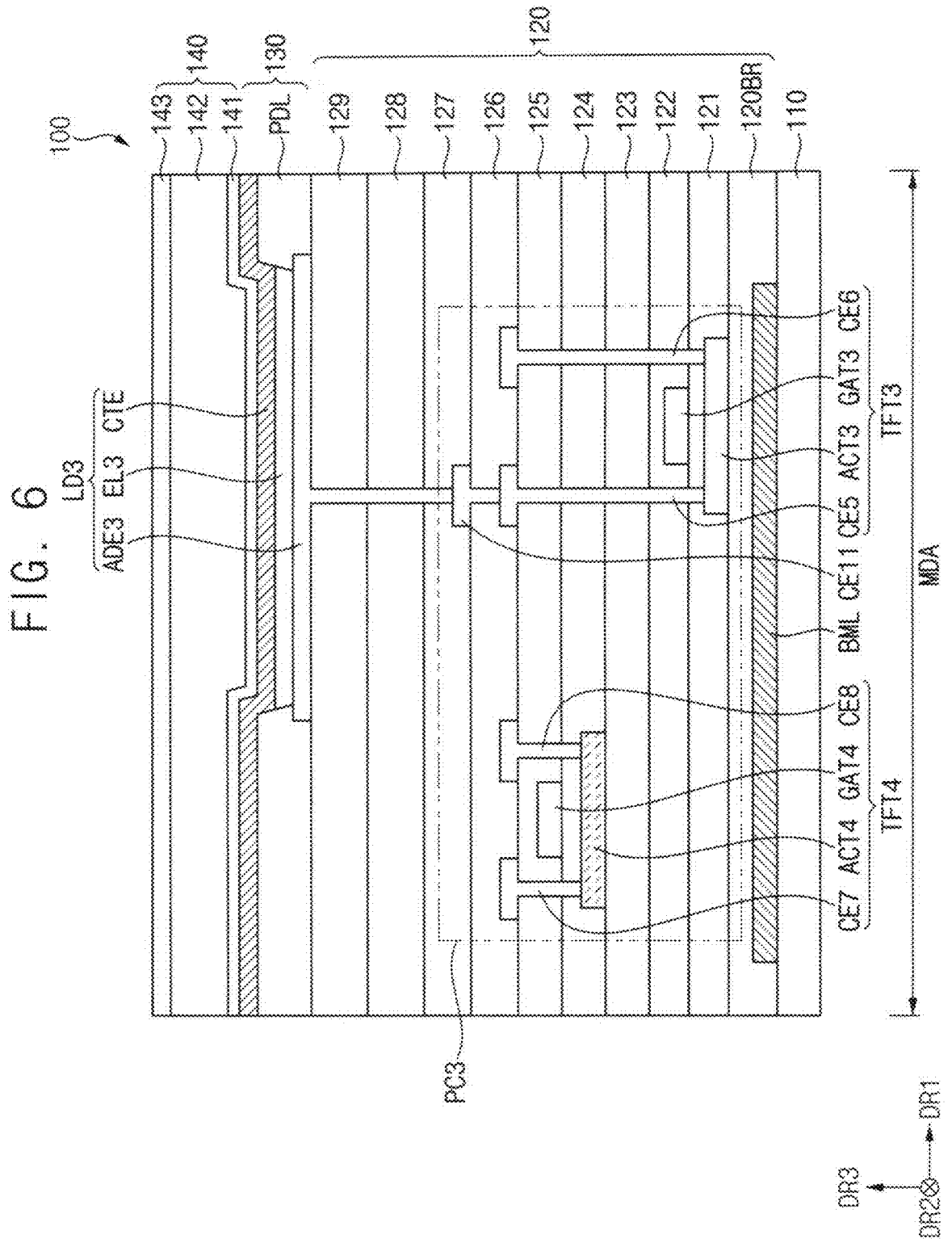
FIG. 6 is a cross-sectional view illustrating a main display area of the display panel of FIG. 3.

FIG. 5 is a cross-sectional view illustrating a first auxiliary display area and a second auxiliary display area of the display panel of FIG. 3. FIG. 6 is a cross-sectional view illustrating a main display area of the display panel of FIG. 3.

Referring to FIGS. 5 and 6, the display panel 100 may include an inorganic layer, an organic layer, and a metal pattern. As described above, the display panel 100 may include the base substrate 110, the pixel circuit layer 120, the light-emitting device layer 130, and the encapsulation layer 140.

The pixel circuit layer 120 may be disposed on the base substrate 110. In an embodiment, the pixel circuit layer 120 may include a buffer layer 120BR, first to ninth insulating layers 121, 122, 123, 124, 125, 126, 127, 128, 129, and the first to third pixel circuits PC1, PC2, and PC3, a first connection line TWL1, and a second connection line TWL2.

Each of the first to third pixel circuits PC1, PC2, and PC3 may include a transistor. In an embodiment, the first pixel circuit PC1 may include a first transistor TFT1, the second pixel circuit PC2 may include a second transistor TFT2, and the third pixel circuit PC3 may include a third transistor TFT3 and a fourth transistor TFT4. Each of the first to fourth transistors TFT1, TFT2, TFT3, and TFT4 may include an active pattern, a gate electrode, and a connection electrode, for example.

The buffer layer 120BR may be disposed on the base substrate 110. The buffer layer 120BR may prevent the diffusion of impurities from the base substrate 110 to the first to third pixel circuits PC1, PC2, and PC3. In an embodiment, the buffer layer 120BR may include an insulating material. In an embodiment, the material that may be used for the buffer layer 120BR may include silicon oxide, silicon nitride, silicon oxynitride, or the like. These may be used alone or in combination with each other.

In an embodiment, a back metal layer BML may be disposed between the base substrate 110 and the buffer layer 120BR. The back metal layer BML may be disposed to overlap the first to third pixel circuits PC1, PC2, and PC3. Also, the back metal layer BML may be disposed to be spaced apart from the first auxiliary display area SDA1.

In an embodiment, first to third active patterns ACT1, ACT2, and ACT3 may be disposed on the buffer layer 120BR. In an embodiment, the first to third active patterns ACT1, ACT2, and ACT3 may include a silicon semiconductor, for example.

In another embodiment, the first and second active patterns ACT1 and ACT2 may be disposed on the third insulating layer 123. In this case, the first and second active patterns ACT1 and ACT2 may include an oxide semiconductor.

The first insulating layer 121 may be disposed on the buffer layer 120BR and cover the first to third active patterns ACT1, ACT2, and ACT3. The first insulating layer 121 may have a single-layer or multi-layer structure. In an embodiment, the first insulating layer 121 may include an insulating material. In an embodiment, the material that may be used as the first insulating layer 121 may include silicon oxide, silicon nitride, silicon oxynitride, or the like. These may be used alone or in combination with each other.

The first to third gate electrodes GAT1, GAT2, and GAT3 may be disposed on the first insulating layer 121. Specifically, the first gate electrode GAT1 may overlap the first active pattern ACT1, the second gate electrode GAT2 may overlap the second active pattern ACT2, and the third gate electrode GAT3 may overlap the third active pattern ACT3. In an embodiment, the first to third gate electrodes GAT1, GAT2, and GAT3 may include a metal, an alloy, a conductive metal oxide, a transparent conductive material, or the like. In an embodiment, materials that may be used as the first to third gate electrodes GAT1, GAT2, and GAT3 may include silver (Ag), an alloy containing silver, molybdenum (Mo), an alloy containing molybdenum, aluminum (Al), Alloys including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other.

The second insulating layer 122 may be disposed on the first insulating layer 121 and cover the first to third gate electrodes GAT1, GAT2, and GAT3. The second insulating layer 122 may have a single-layer or multi-layer structure. In an embodiment, the second insulating layer 122 may include an insulating material. In an embodiment, the material that may be used as the second insulating layer 122 may include silicon oxide, silicon nitride, silicon oxynitride, or the like. These may be used alone or in combination with each other.

The third insulating layer 123 may be disposed on the second insulating layer 122. The third insulating layer 123 may have a single-layer or multi-layer structure. In an embodiment, the third insulating layer 123 may include an insulating material. In an embodiment, the material that may be used as the third insulating layer 123 may include silicon oxide, silicon nitride, silicon oxynitride, or the like. These may be used alone or in combination with each other.

A fourth active pattern ACT4 may be disposed on the third insulating layer 123. The fourth active pattern ACT4 may include an oxide semiconductor.

The fourth insulating layer 124 may be disposed on the third insulating layer 123 and cover the fourth active pattern ACT4. The fourth insulating layer 124 may have a single-layer or multi-layer structure. In an embodiment, the fourth insulating layer 124 may include an insulating material. In an embodiment, the material that may be used as the fourth insulating layer 124 may include silicon oxide, silicon nitride, silicon oxynitride, or the like. These may be used alone or in combination with each other.

The fourth gate electrode GAT4 may be disposed on the fourth insulating layer 124. The fourth gate electrode GAT4 may overlap the fourth active pattern ACT4. In an embodiment, the fourth gate electrode GAT4 may include a metal, an alloy, a conductive metal oxide, a transparent conductive material, or the like. In an embodiment, the material that may be used as the fourth gate electrode GAT4 include silver (Ag), an alloy containing silver, molybdenum (Mo), an alloy containing molybdenum, aluminum (Al), an alloy containing aluminum, and aluminum nitride. (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other.

The fifth insulating layer 125 may be disposed on the fourth insulating layer 124 and cover the fourth gate electrode GAT4. The fifth insulating layer 125 may have a single-layer or multi-layer structure. In an embodiment, the fifth insulating layer 125 may include an insulating material. In an embodiment, a material that may be used as the fifth insulating layer 125 may include silicon oxide, silicon nitride, silicon oxynitride, or the like. These may be used alone or in combination with each other.

First to eighth connection electrodes CE1, CE2, CE3, CE4, CE5, CE6, CE7, and CE8 may be disposed on the fifth insulating layer 125. The first connection electrode CE1 and the second connection electrode CE2 may contact the first active pattern ACT1 through a contact hole penetrating the first to fifth insulating layers 121, 122, 123, 124, 125. The third connection electrode CE3 and the fourth connection electrode CE4 may contact the second active pattern ACT2 through a contact hole penetrating the first to fifth insulating layers 121, 122, 123, 124, 125. The fifth connection electrode CE5 and the sixth connection electrode CE6 may contact the third active pattern ACT3 through a contact hole penetrating the first to fifth insulating layers 121, 122, 123, 124, 125. The seventh connection electrode CE7 and the eighth connection electrode CE8 may contact the fourth active pattern ACT4 through a contact hole penetrating the fourth and fifth insulating layers 124 and 125.

In an embodiment, the first to eighth connection electrodes CE1, CE2, CE3, CE4, CE5, CE6, CE7, CE8 may include a metal, an alloy, a conductive metal oxide, a transparent conductive material, or the like. In an embodiment, materials that may be used as the first to eighth connection electrodes CE1, CE2, CE3, CE4, CE5, CE6, CE7, and CE8 may include silver (Ag), an alloy containing silver, molybdenum (Mo), and molybdenum. Alloys including aluminum (Al), alloys including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other.

The first active pattern ACT1, the first gate electrode GAT1, the first connection electrode CE1, and the second connection electrode CE2 may constitute the first transistor TFT1. In addition, the second active pattern ACT2, the second gate electrode GAT2, the third connection electrode CE3, and the fourth connection electrode CE4 may constitute the second transistor TFT2. In addition, the third active pattern ACT3, the third gate electrode GAT3, the fifth connection electrode CE5, and the sixth connection electrode CE6 may constitute the third transistor TFT3. In addition, the fourth active pattern ACT4, the fourth gate electrode GAT4, the seventh connection electrode CE7, and the eighth connection electrode CE8 may constitute the fourth transistor TFT4.

In an embodiment, the third transistor TFT3 may be a silicon-based semiconductor device included in the third pixel circuit PC3, and the fourth transistor TFT4 may be an oxide-based semiconductor device. Accordingly, in the third pixel PX3 of the main display area MDA, the color change of the image according to the voltage drop may not be large even when the low frequency driving is performed. That is, since the third pixel circuit PC3 employs the fourth transistor TFT4 which is an oxide-based semiconductor device, low-frequency driving is possible, and thus power consumption may be further reduced. However, the configuration of the invention is not necessarily limited thereto. In an embodiment, the third pixel circuit PC3 may use only one of a silicon-based semiconductor device and an oxide-based semiconductor device as a transistor, for example.

The sixth insulating layer 126 may be disposed on the fifth insulating layer 125 and cover the first to eighth connection electrodes CE1, CE2, CE3, CE4, CE5, CE6, CE7, and CE8. The sixth insulating layer 126 may have a single-layer or multi-layer structure. In an embodiment, the sixth insulating layer 126 may include an insulating material. In an embodiment, the material that may be used as the sixth insulating layer 126 may include photoresist, polyacrylic resin, polyimide resin, acrylic resin, or the like. These may be used alone or in combination with each other.

Ninth to eleventh connection electrodes CE9, CE10, and CE11 may be disposed on the sixth insulating layer 126. The ninth connection electrode CE9 may contact the first connection electrode CE1 through a contact hole penetrating the sixth insulating layer 126, and the tenth connection electrode CE10 may contact the third connection electrode CE3 through a contact hole penetrating the sixth insulating layer 126.

The first transistor TFT1 and the ninth connection electrode CE9 may constitute the first pixel circuit PC1. In addition, the second transistor TFT2 and the tenth connection electrode CE10 may constitute the second pixel circuit PC2. In addition, the third transistor TFT3, the fourth transistor TFT4, and the eleventh connection electrode CE11 may constitute the third pixel circuit PC3. In this case, the first pixel circuit PC1 and the second pixel circuit PC2 may be disposed in the second auxiliary display area SDA2, and the third pixel circuit PC3 may be disposed in the main display area MDA.

The seventh insulating layer 127 may be disposed on the sixth insulating layer 126 and cover the ninth to eleventh connection electrodes CE9, CE10, and CE11. The seventh insulating layer 127 may have a single-layer or multi-layer structure. In an embodiment, the seventh insulating layer 127 may include an insulating material. In an embodiment, the material that may be used as the seventh insulating layer 127 may include photoresist, polyacrylic resin, polyimide resin, acrylic resin, or the like. These may be used alone or in combination with each other.

The first connection line TWL1 may be disposed on the seventh insulating layer 127. The first connection line TWL1 may contact the ninth connection electrode CE9 of the first pixel circuit PC1 through a contact hole penetrating the seventh insulating layer 127. In an embodiment, the first connection line TWL1 may overlap the plurality of transmission holes TH of the common electrode CTE. Accordingly, the first connection line TWL1 may include a light-transmitting material. In an embodiment, a material that may be used as the first connection line TWL1 may include TCO such as ITO, IZO, IGZO, zinc oxide (ZnO), or indium oxide (In2O3), or the like. These may be used alone or in combination with each other.

The eighth insulating layer 128 may be disposed on the seventh insulating layer 127 and cover the first connection line TWL1. The eighth insulating layer 128 may have a single-layer or multi-layer structure. In an embodiment, the eighth insulating layer 128 may include an insulating material. In an embodiment, the material that may be used as the eighth insulating layer 128 may include photoresist, polyacrylic resin, polyimide resin, acrylic resin, or the like. These may be used alone or in combination with each other.

The second connection line TWL2 may be disposed on the eighth insulating layer 128. The second connection line TWL2 may contact the first connection line TWL1 through a contact hole penetrating the eighth insulating layer 128. Also, the second connection line TWL2 may be connected to a first pixel electrode ADE1 of the first light-emitting device LD1. Accordingly, the first connection line TWL1 and the second connection line TWL2 may electrically connect the first pixel circuit PC1 and the first light-emitting device LD1. In an embodiment, the material that may be used as the second connection line TWL2 may include TCO such as ITO, IZO, IGZO, zinc oxide (ZnO), or indium oxide (In2O3), or the like. These may be used alone or in combination with each other.

The ninth insulating layer 129 may be disposed on the eighth insulating layer 128 and cover the second connection line TWL2. The ninth insulating layer 129 may have a single-layer or multi-layer structure. In an embodiment, the ninth insulating layer 129 may include an insulating material. In an embodiment, the material that may be used as the ninth insulating layer 129 may include photoresist, polyacrylic resin, polyimide resin, acrylic resin, or the like. These may be used alone or in combination with each other.

The light-emitting device layer 130 may be disposed on the pixel circuit layer 120. In an embodiment, the light-emitting device layer 130 may include the first to third light-emitting devices LD1, LD2, and LD3, a pixel defining layer PDL, and a pixel defining pattern PDP. The first light-emitting device LD1 may be disposed in the first auxiliary display area SDA1, the second light-emitting device LD2 may be disposed in the second auxiliary display area SDA2, and the third light-emitting device LD3 may be disposed in the main display area MDA. The first light-emitting device LD1 may include the first pixel electrode ADE1, a first light-emitting layer EL1, and the common electrode CTE, the second light-emitting device LD2 may include a second pixel electrode ADE2 and a second light-emitting layer EL2 and the common electrode CTE, and the third light-emitting device LD3 may include a third pixel electrode ADE3, a third light-emitting layer EL3, and the common electrode CTE.

The first to third pixel electrodes ADE1, ADE2, and ADE3 may be disposed on the ninth insulating layer 129. Specifically, the first pixel electrode ADE1 may be disposed in the first auxiliary display area SDA1, the second pixel electrode ADE2 may be disposed in the second auxiliary display area SDA2, and the third pixel electrode ADE3 may be disposed in the main display area MDA.

In an embodiment, each of the first to third pixel electrodes ADE1, ADE2, and ADE3 may be formed as a transmissive electrode or as a reflective electrode. When each of the first to third pixel electrodes ADE1, ADE2, and ADE3 is formed as a transmissive electrode, embodiments of a material that may be used for the first to third pixel electrodes ADE1, ADE2, and ADE3 may include ITO, IZO, IGZO, zinc oxide (ZnO), indium oxide (In2O3), aluminum-doped zinc oxide ("AZO"), or the like. These may be used alone or in combination with each other. When each of the first to third pixel electrodes ADE1, ADE2, and ADE3 is formed as a reflective electrode, embodiments of materials that may be used for the first to third pixel electrodes ADE1, ADE2, and ADE3 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or the like. These may be used alone or in combination with each other. In addition, they may have a laminated structure with the material used for the transmissive electrode.

As described above, the first pixel electrode ADE1 may be electrically connected to the first pixel circuit PC1 disposed in the second auxiliary display area SDA2. In an embodiment, the first pixel electrode ADE1 may contact the second connection line TWL2 through a contact hole penetrating the ninth insulating layer 129, for example. Therefore, the first pixel electrode ADE1 may be electrically connected to the first pixel circuit PC1 through the first connection line TWL1 and the second connection line TWL2. The second pixel electrode ADE2 may contact the tenth connection electrode CE10 through a contact hole penetrating the seventh to ninth insulating layers 127, 128, and 129 to make electrical contact with the second pixel circuit PC2. The third pixel electrode ADE3 may contact the eleventh connection electrode CE11 through a contact hole penetrating the seventh to ninth insulating layers 127, 128, and 129 to make electrical contact with the third pixel circuit PC3.

The pixel defining layer PDL and the pixel defining pattern PDP may be disposed on the ninth insulating layer 129. The pixel defining pattern PDP may be disposed in the first auxiliary display area SDA1. The pixel defining pattern PDP may expose a portion of the first pixel electrode ADE1. The pixel defining layer PDL may be disposed in the second auxiliary display area SDA2 and the main display area MDA. The pixel defining layer PDL may expose a portion of each of the second pixel electrode ADE2 and the third pixel electrode ADE3.

In an embodiment, the pixel defining layer PDL and the pixel defining pattern PDP may include the same material and may be formed through the same process. In an embodiment, the pixel defining layer PDL and the pixel defining pattern PDP may include a black dye, a black pigment, carbon black, a metal such as chromium, or an oxide thereof, for example.

The first emission layer EL1 may be disposed on the first pixel electrode ADE1, the second emission layer EL2 may be disposed on the second pixel electrode ADE2, and the third emission layer EL3 may be disposed on the third pixel electrode ADE3. In an embodiment, each of the first to third light-emitting layers EL1, EL2, and EL3 may emit red light, green light, or blue light.

The common electrode CTE may be disposed on the first to third emission layers EL1, EL2, and EL3. That is, the common electrode CTE may be continuously formed on the display area DA across the plurality of pixels PX (refer to FIG. 3). In an embodiment, the common electrode CTE may include a transmissive electrode or a reflective electrode. In an embodiment, the common electrode CTE may include a metal, an alloy, a metal nitride, a metal fluoride, a conductive metal oxide, or any combinations thereof, for example.

The plurality of transmission holes TH may be defined in the common electrode CTE. The plurality of transmission holes TH may be defined in the first auxiliary display area SDA1. In an embodiment, after the common electrode CTE is continuously formed on the plurality of pixels PX, a laser may be applied to each region between the plurality of first light-emitting devices LD1 among the common electrodes CTE in the form of dots. Therefore, the plurality of transmission holes TH may be defined by removing the common electrode CTE of the portion irradiated with the laser. Accordingly, the plurality of transmission holes TH may be defined to be spaced apart from the pixel defining pattern PDP. As a portion of the common electrode CTE is removed from the portion where the plurality of transmission holes TH is disposed, the transmittance of the first auxiliary display area SDA1 may be improved.

Although not shown, a hole control layer may be disposed between the first to third pixel electrodes ADE1, ADE2, and ADE3 and the first to third emission layers EL1, EL2, and EL3. The hole control layer may include a hole transport layer and may further include a hole injection layer. An electron control layer may be disposed between the first to third emission layers EL1, EL2, and EL3 and the common electrode CTE. The electron control layer may include an electron transport layer and may further include an electron injection layer.

The encapsulation layer 140 may be disposed on the light-emitting device layer 130. In an embodiment, the encapsulation layer 140 may include a first inorganic encapsulation layer 141 disposed on the light-emitting device layer 130, an organic encapsulation layer 142 disposed on the first inorganic encapsulation layer 141, and a second inorganic encapsulation layer 143 disposed on the organic encapsulation layer 142. However, the configuration of the encapsulation layer 140 is not necessarily limited thereto.

Figure 7:
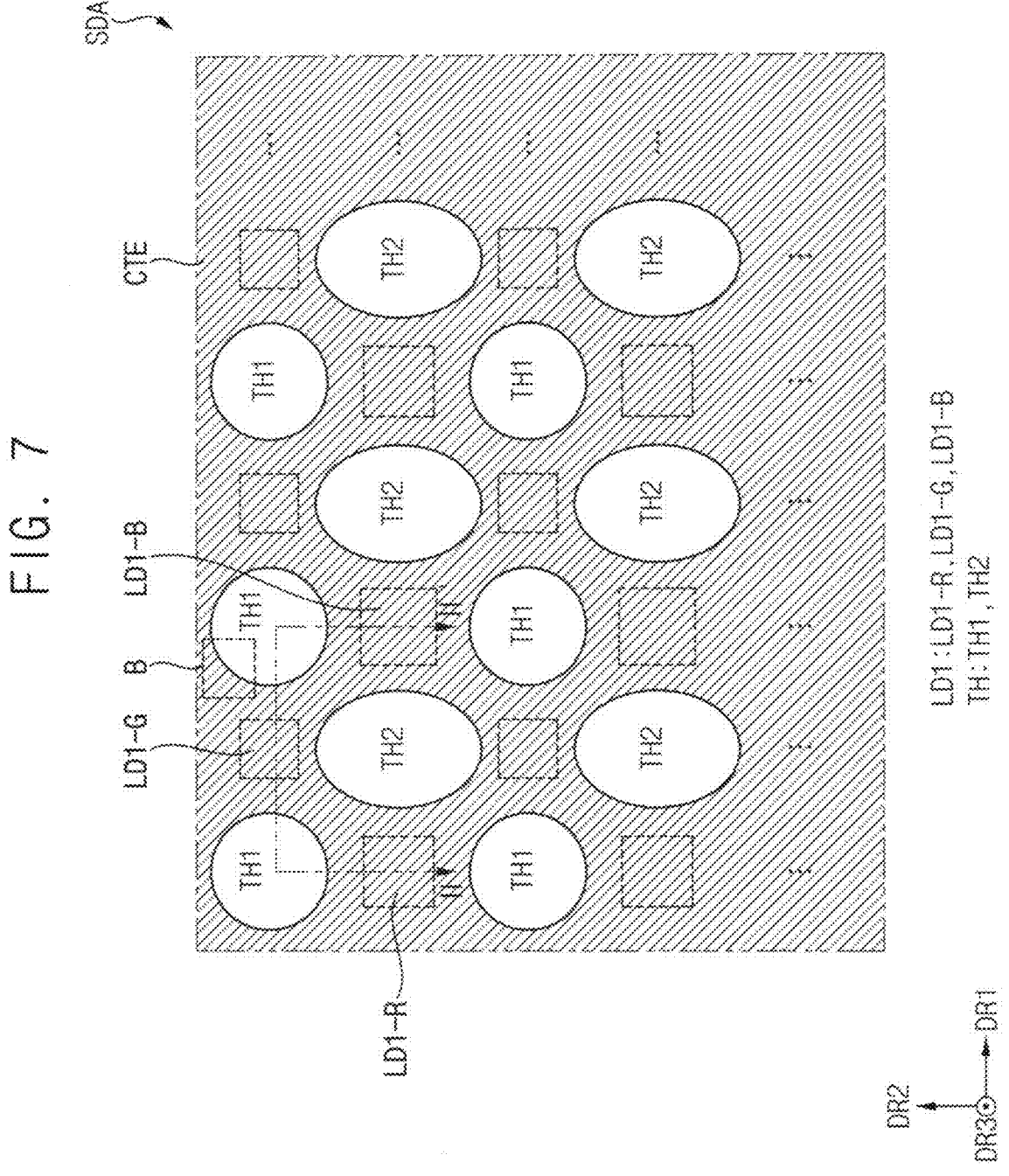
FIG. 7 is a plan view illustrating a first auxiliary display area of the display panel of FIG. 3.
Figure 8:
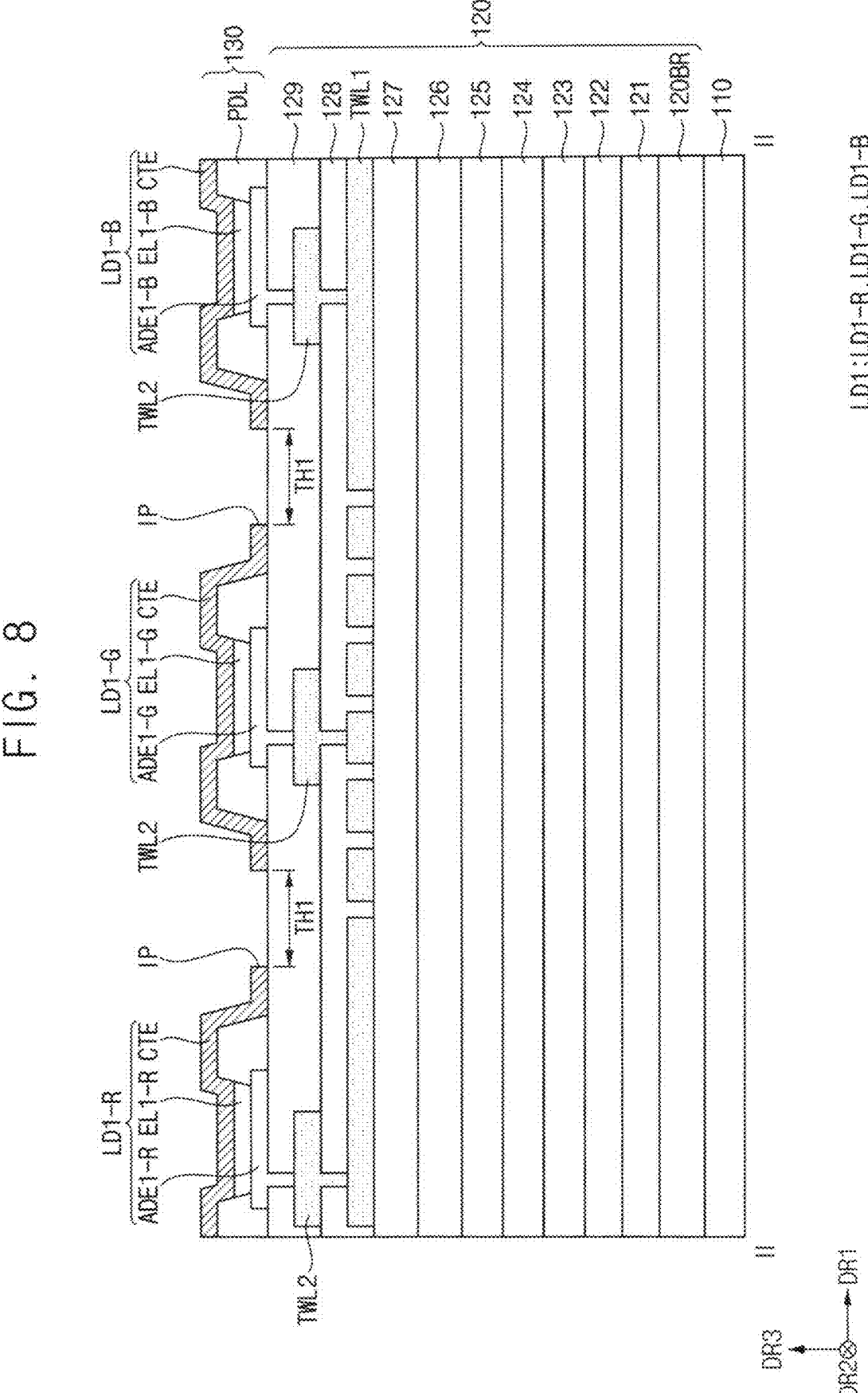
FIG. 8 is a cross-sectional view taken along line II-II' of FIG. 7.

FIG. 7 is a plan view illustrating a first auxiliary display area of the display panel of FIG. 3. In an embodiment, FIG. 7 is a plan view illustrating the first auxiliary display area SDA1 before the encapsulation layer 140 is formed on the light-emitting device layer 130, for example. FIG. 8 is a cross-sectional view taken along line II-II' of FIG. 7.

Hereinafter, the plurality of first light-emitting devices LD1 and the plurality of transmission holes TH will be described in more detail with reference to FIGS. 7 and 8. In this case, descriptions that overlap with those described with reference to FIGS. 5 and 6 with respect to the configuration of the display panel 100 will be omitted.

Referring to FIGS. 7 and 8, the plurality of first light-emitting devices LD1 may be disposed in the first auxiliary display area SDA1 of the display panel 100. In an embodiment, the plurality of first light-emitting devices LD1 may include the first color light-emitting device LD1-R, the second color light-emitting device LD1-G, and the third color light-emitting device LD1-B. In an embodiment, each of the first color light-emitting device LD1-R, the second color light-emitting device LD1-G, and the third color light-emitting device LD1-B may emit red light, green light, or blue light. In an embodiment, the first color light-emitting device LD1-R may emit red light, the second color light-emitting device LD1-G may emit green light, and the third color light-emitting device LD1-B may emit blue light, for example.

The first color light-emitting device LD1-R may include a first color pixel electrode ADE1-R, a first color light-emitting layer EL1-R and the common electrode CTE, the second color light-emitting device LD1-G may include a second color pixel electrode ADE1-G, a second color emission layer EL1-G, and the common electrode CTE, and the third color light-emitting device LD1-B may include a third color pixel electrode ADE1-B a third color emission layer EL1-B and the common electrode CTE.

In a plan view, each of the first color light-emitting device LD1-R, the second color light-emitting device LD1-G, and the third color light-emitting device LD1-B may be repeatedly arranged along a row direction and a column direction. Specifically, in a plan view, each of the first color light-emitting device LD1-R, the second color light-emitting device LD1-G, and the third color light-emitting device LD1-B may be repeatedly arranged along the first direction DR1 and the second directions DR2. In an embodiment, the second color light-emitting devices LD1-G may be repeatedly arranged in odd rows of the first auxiliary display area SDA1, and the first color light-emitting device LD1-R and the third color light-emitting device may be repeatedly arranged in even rows of the first auxiliary display area SDA1.

In an embodiment, the first color light-emitting device LD1-R, the second color light-emitting device LD1-G, and the third color light-emitting device LD1-B may have different sizes in a plan view. In an embodiment, a size in a plan view of the second color light-emitting device LD1-G may be smaller than a size in a plan view of each of the first color light-emitting device LD1-R and the third color light-emitting device LD1-B. In this case, the size in a plan view of the third color light-emitting device LD1-B may be larger than the size in a plan view of the first color light-emitting device LD1-R. However, the configuration of the invention is not necessarily limited thereto, and the size in a plan view of each of the first color light-emitting device LD1-R, the second color light-emitting device LD1-G, and the third color light-emitting device LD1-B may be variously set.

Each of the first color light-emitting device LD1-R, the second color light-emitting device LD1-G, and the third color light-emitting device LD1-B may have a planar shape of a polygonal planar shape, a circular planar shape, and an elliptical planar shape, a track type planar shape, or the like. In an embodiment, each of the first color light-emitting devices LD1-R, the second color light-emitting devices LD1-G, and the third color light-emitting devices LD1-B may have a quadrangular (e.g., rectangular) planar shape.

In the first auxiliary display area SDA1, the plurality of transmission holes TH may be defined in the common electrode CTE. In an embodiment, the plurality of transmission holes TH may include a plurality of first transmission holes TH1 and a plurality of second transmission holes TH2.

In a plan view, each of the plurality of first transmission holes TH1 and the plurality of second transmission holes TH2 may be repeatedly arranged along the row direction and the column direction. Specifically, each of the plurality of first transmission holes TH1 and the plurality of second transmission holes TH2 may be repeatedly arranged along the first direction DR1 and the second direction DR2 in a plan view. have. In this case, each of the plurality of first transmission holes TH1 and the plurality of second transmission holes TH2 may be provided between adjacent first light-emitting devices among the plurality of first light-emitting devices LD1. Accordingly, the plurality of first light-emitting devices LD1 and the plurality of transmission holes TH may be alternately arranged in a plan view.

In an embodiment, the plurality of first transmission holes TH1 may be repeatedly arranged in the odd rows of the first auxiliary display area SDA1, and thus the first transmission holes TH1 may be alternately arranged with the second color light-emitting devices LD1-G along the first direction DR1, for example. The plurality of second transmission holes TH2 may be repeatedly arranged in the even rows of the first auxiliary display area SDA1, and thus the second transmission holes TH2 may be alternately arranged with the first color light-emitting devices LD1-R and the third color light-emitting devices LD1-B along the first direction DR1.

In other words, the plurality of transmission holes TH may be repeatedly arranged in the first direction DR1 and the second direction DR2, and disposed between adjacent first pixel electrodes among the plurality of first pixel electrodes ADE1. Accordingly, the plurality of first pixel electrodes ADE1 and the plurality of transmission holes TH may be alternately arranged in a plan view.

In an embodiment, the plurality of transmission holes TH may be defined by selectively removing a laser-irradiated portion of the common electrode CTE in the first auxiliary display area SDA1. In an embodiment, the laser may be irradiated in the form of dots for each region between the plurality of first light-emitting devices LD1, for example. Accordingly, the plurality of transmission holes TH may be defined to be spaced apart from the pixel defining pattern PDP.

In an embodiment, as described above, the first color light-emitting device LD1-R, the second color light-emitting device LD1-G, and the third color light-emitting device LD1-B may have different sizes. In this case, the plurality of transmission holes TH may have different shapes depending on the sizes of the first light-emitting devices LD1 adjacent in the first direction D1. In an embodiment, as the plurality of first transmission holes TH1 is adjacent to the second color light-emitting device LD1-G in the first direction D1, they may have a first planar shape, for example. As the plurality of second transmission holes TH2 is adjacent to the first color light-emitting device LD1-R and the third color light-emitting device LD1-B in the first direction D1, they may have a second planar shape different from the first planar shape. In FIG. 7, the first planar shape is shown in a circular shape and the second planar shape is shown in an elliptical shape, but the configuration of the invention is not necessarily limited thereto.

In an embodiment, the inner surfaces IP of the common electrode CTE exposed by the plurality of transmission holes TH may be perpendicular to the top surface of the common electrode CTE. Accordingly, the cross-section of the plurality of transmission holes TH may have a quadrangular (e.g., rectangular) shape. However, the configuration of the invention is not necessarily limited thereto. In an embodiment, the inner surfaces IP of the common electrode CTE may be inclined toward the upper surface of the common electrode CTE, for example. In this case, the cross-section of the plurality of transmission holes TH may have a trapezoidal shape.

Figure 9:
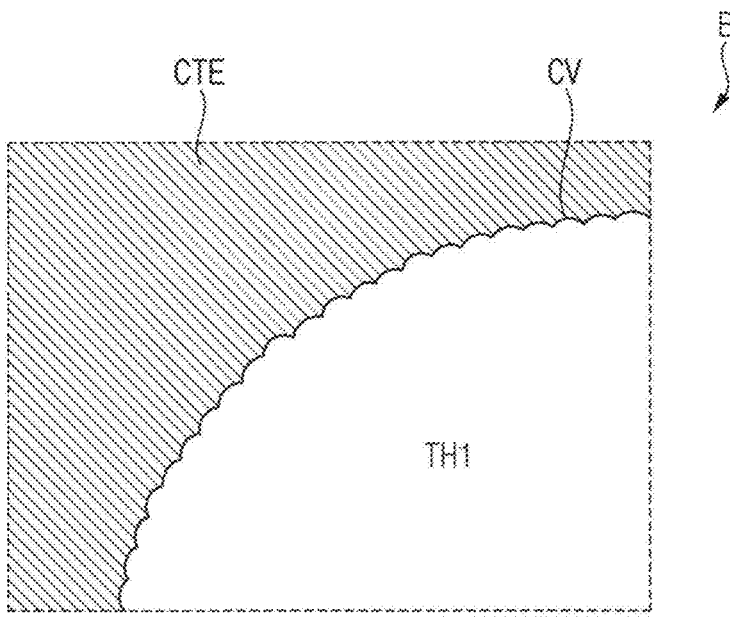
FIG. 9 is an enlarged view illustrating an enlarged area 'B' of FIG. 7.

FIG. 9 is an enlarged view illustrating an enlarged area 'B' of FIG. 7.

Referring to FIGS. 7 to 9, the plurality of through holes TH may include a plurality of curves CV. In detail, the plurality of curves CV may be defined on at least one of the inner surfaces IP of the common electrode CTE exposed by the plurality of through holes TH. In an embodiment, the inner surfaces IP of the common electrode CTE may define outlines of the plurality of transmission holes TH in a plan view, for example. The outline of the plurality of transmission holes TH may include curved lines convex toward the outside of the plurality of transmission holes TH. In other words, the plurality of curves CV may include a curve concave toward the inside of the common electrode CTE. The size of the curve may be variously implemented according to the spot size and intensity of the laser irradiated to the common electrode CTE to form the plurality of transmission holes TH.

Figure 10:
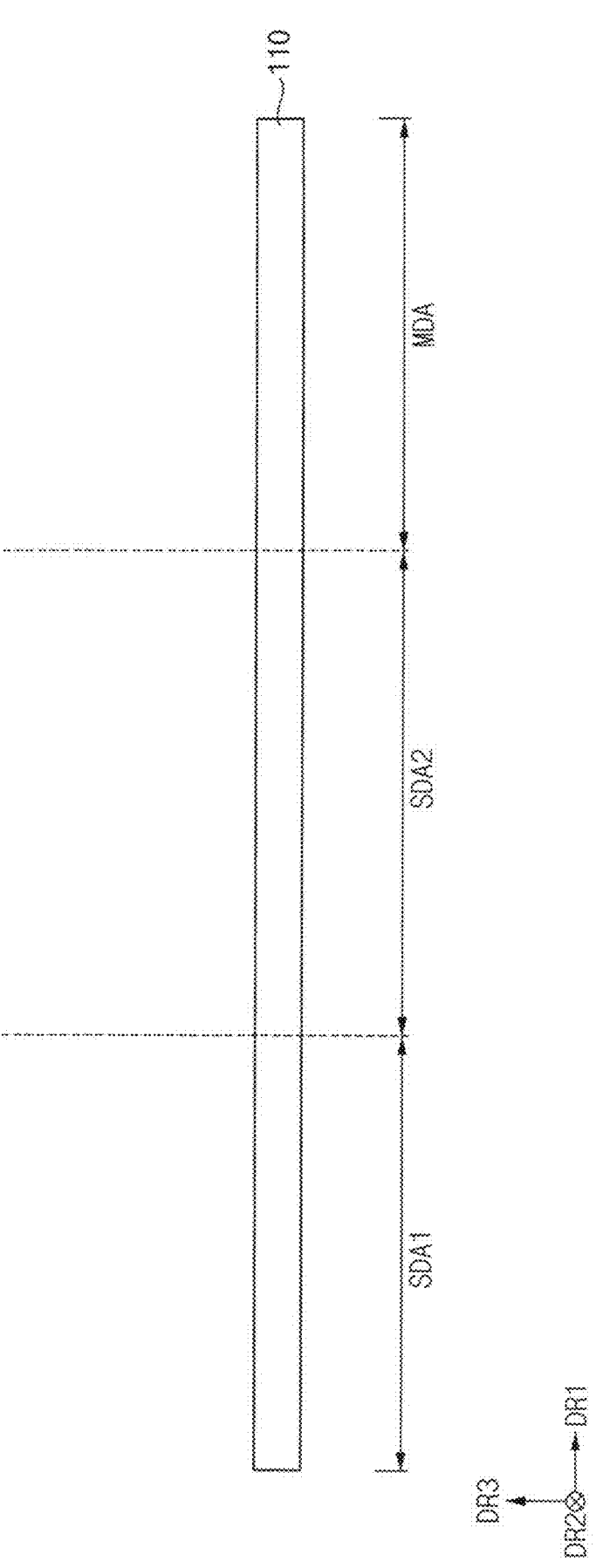
Figure 11:
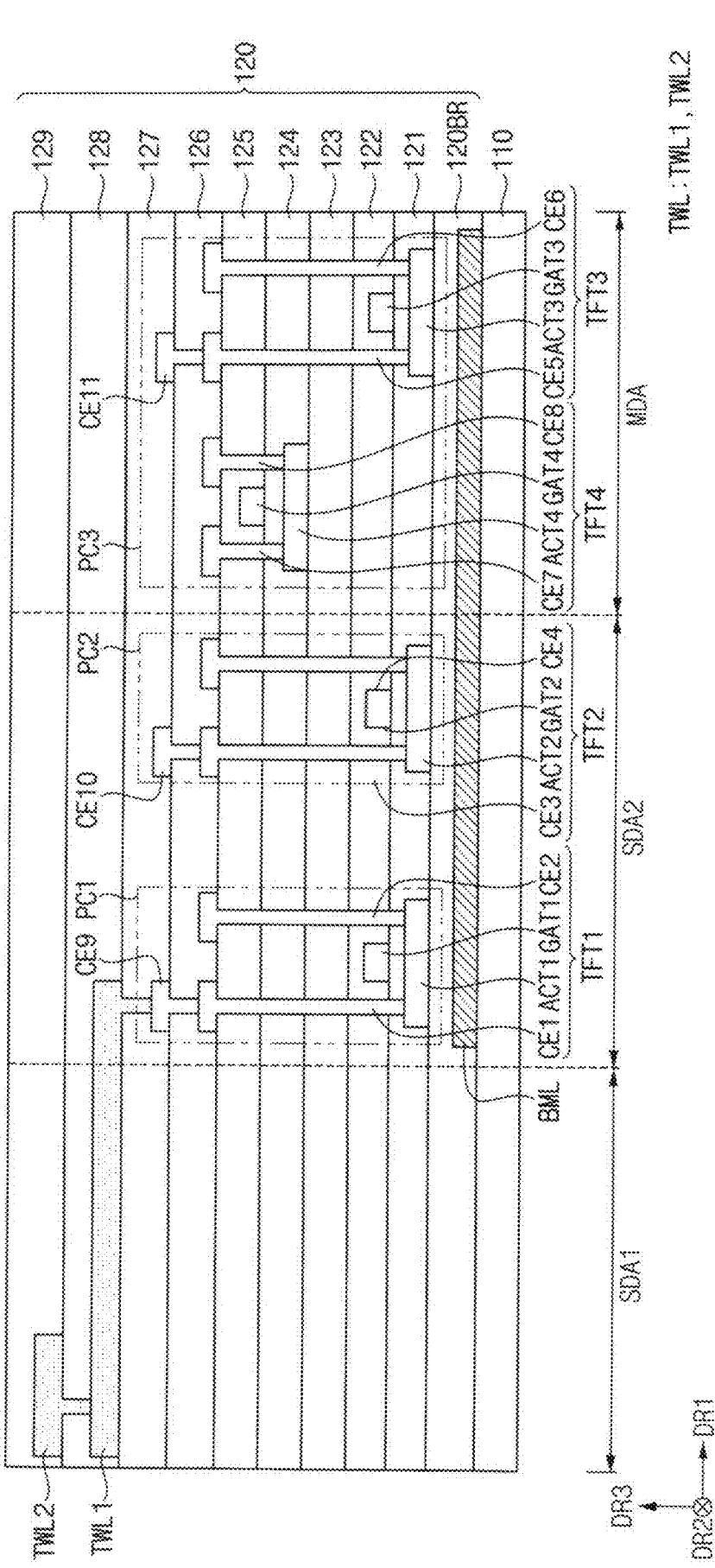
Figure 12:
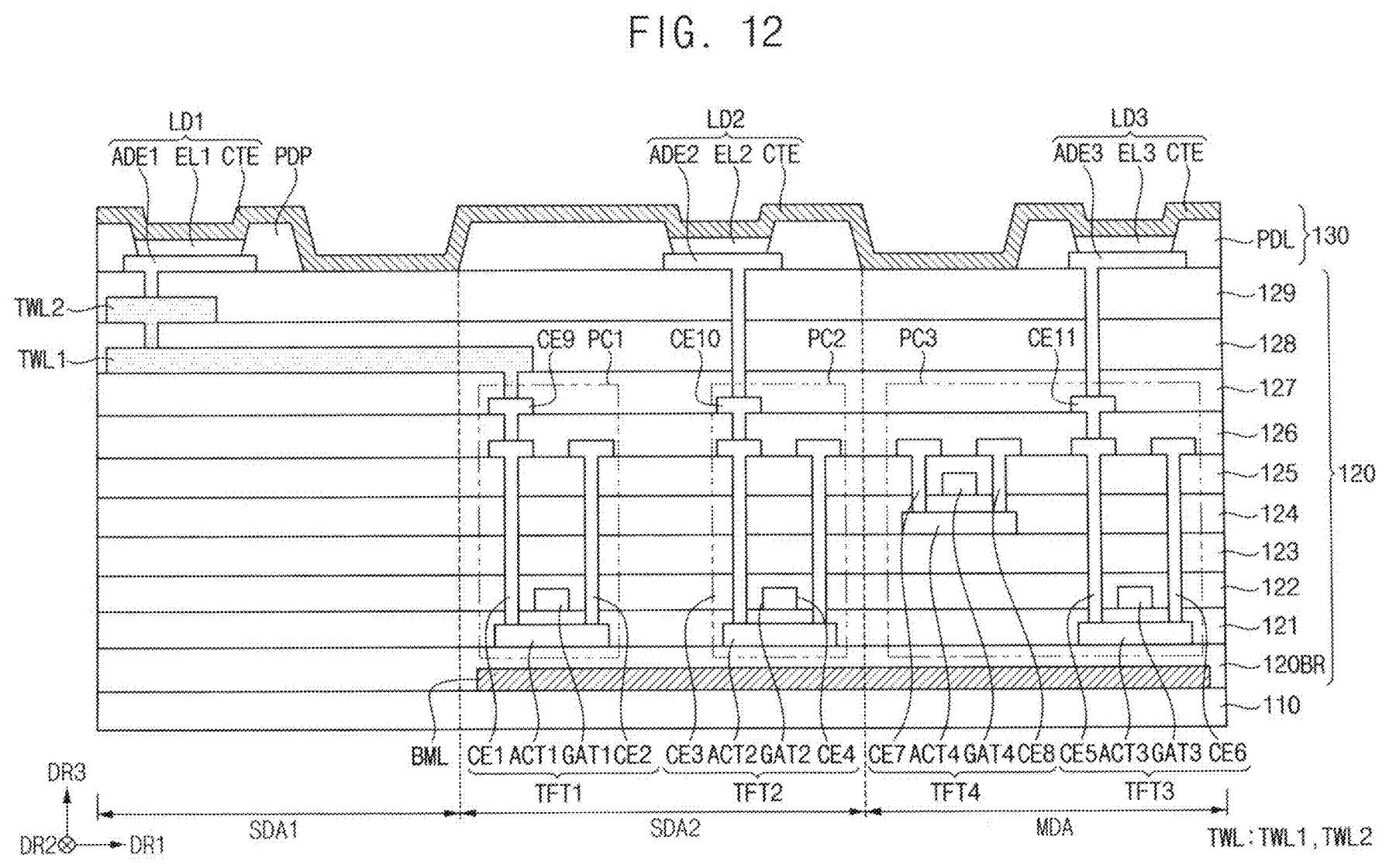
Figure 13:
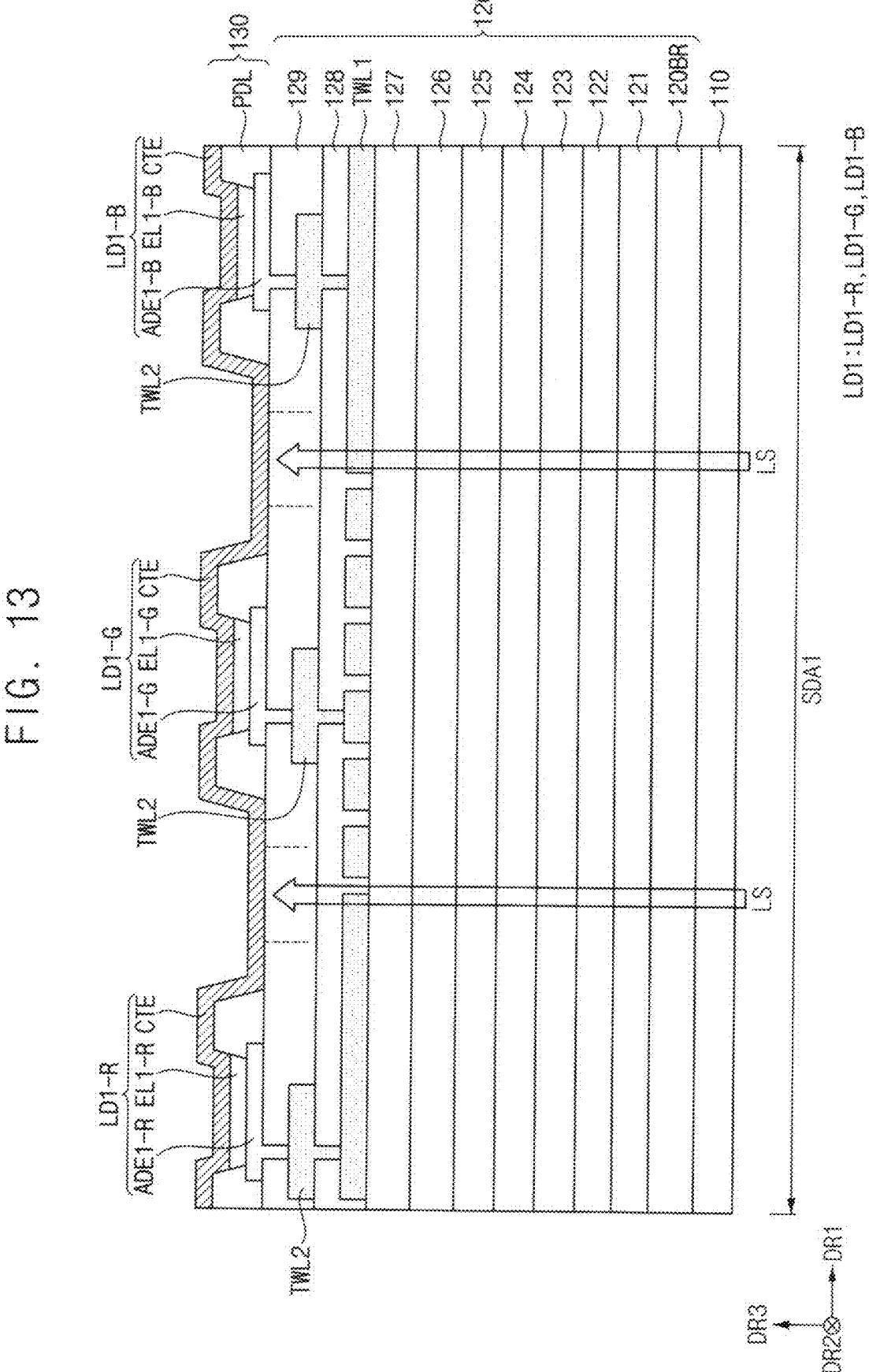
Figure 14:
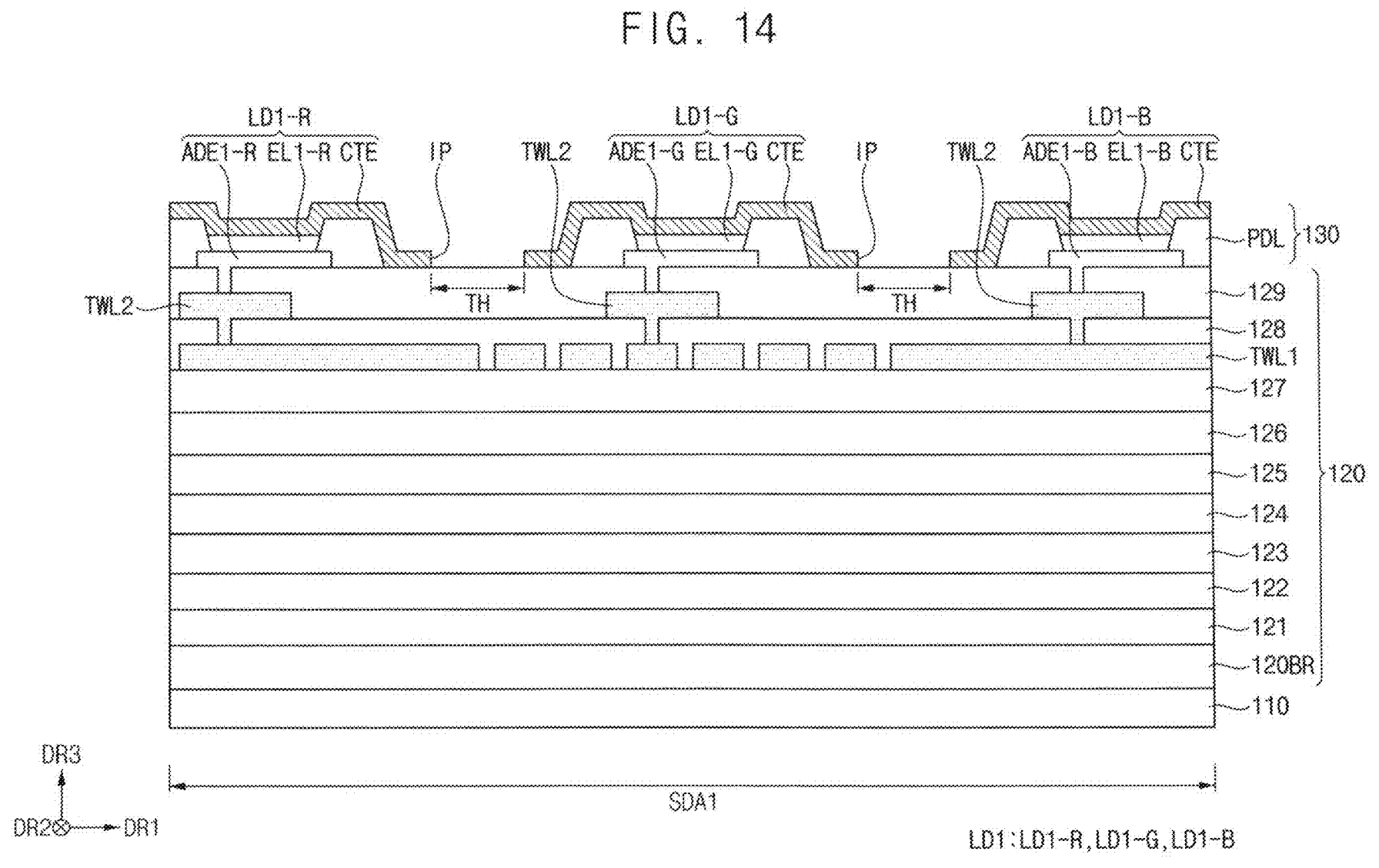
Figure 15:
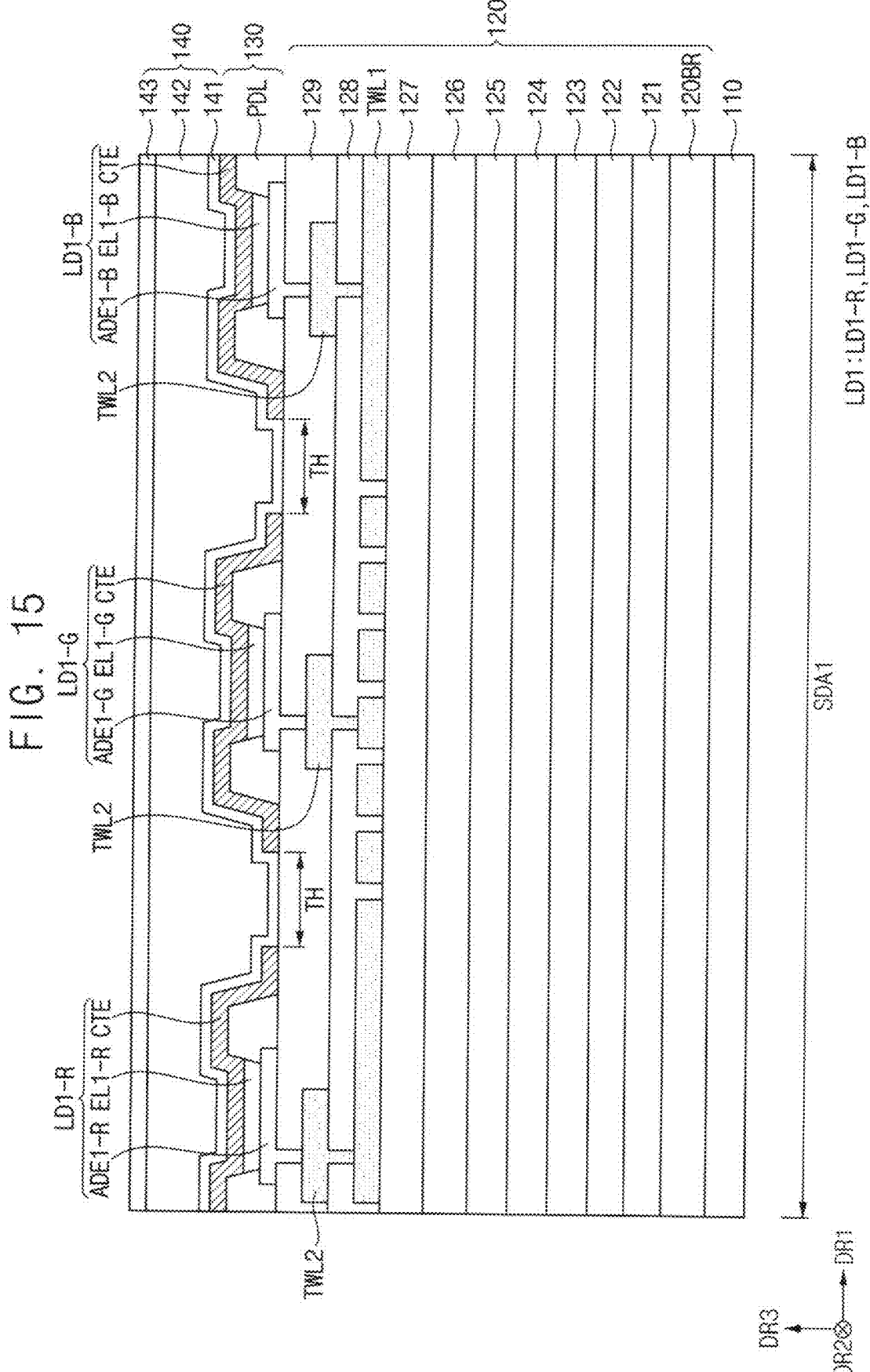

FIGS. 10 to 15 are cross-sectional views illustrating a method of manufacturing a display panel included in the display device of FIG. 1. In this case, FIGS. 10 to 12 are cross-sectional views illustrating all of the first auxiliary display area SDA1, the second auxiliary display area SDA2, and the main display area MDA of the display panel 100, and FIGS. 13 to 15 are cross-sectional views illustrating only the first auxiliary display area SDA1 of the display panel 100 in more detail. Hereinafter, a method of manufacturing the display panel 100 included in the display device 1000 of FIG. 1 will be described with reference to FIGS. 10 to 15.

Referring to FIGS. 10 and 11, first, the base substrate 110 including the first auxiliary display area SDA1 and the main display area MDA may be prepared. In this case, the base substrate 110 may further include a second auxiliary display area SDA2. Thereafter, the pixel circuit layer 120 may be formed on the base substrate 110. Specifically, by forming the insulating layer, the semiconductor layer, and the metal layer by means of coating, deposition, or the like, and then selectively patterning the insulating layer, the semiconductor layer, and the metal layer by a photolithography method, the first to fourth active patterns ACT1, ACT2, ACT3, ACT4, the first to fourth gate electrodes GAT1, GAT2, GAT3, GAT4, the first to eleventh connection electrodes CE1, CE2, CE3, CE4, CE5, CE6, CE7, CE8, CE9, CE10, CE11, the first connection line TWL1 and the second connection line TWL2 may be formed. Accordingly, the first pixel circuit PC1 and the second pixel circuit PC2 may be formed in the second auxiliary display area SDA2, and the third pixel circuit PC3 may be formed in the main display area MDA.

In an embodiment, before forming the pixel circuit layer 120, the back metal layer BML may be additionally formed on the base substrate 110. The back metal layer BML may be formed in a position overlapping the first to third pixel circuits PC1, PC2, PC3 in the second auxiliary display area SDA2 and the main display area MDA.

Referring to FIG. 12, the light-emitting device layer 130 may be formed on the pixel circuit layer 120. Specifically, after forming the first to third pixel electrodes ADE1, ADE2, and ADE3 on the ninth insulating layer 129, the pixel defining layer PDL and the pixel defining pattern PDP may be formed. In this case, the pixel defining pattern PDP may expose a portion of the first pixel electrode ADE1, and the pixel defining layer PDL may expose a portion of the second pixel electrode ADE2 and the third pixel electrode ADE3.

Thereafter, the first to third emission layers EL1, EL2, and EL3 may be formed on each of the first to third pixel electrodes ADE1, ADE2, and ADE3. Thereafter, the common electrode CTE may be formed on the first to third light-emitting layers EL1, EL2, and EL3. The common electrode CTE may be continuously formed across the plurality of pixels PX (refer to FIG. 3).

Referring to FIGS. 13 and 14, after forming the light-emitting device layer 130, the plurality of transmission holes TH may be defined by irradiating the laser LS to the first auxiliary display area SDA1 from the lower side of the base substrate 110. In this case, the laser LS may be an infrared laser.

In an embodiment, the laser LS may be irradiated in the form of dots for each region between the plurality of first light-emitting devices LD1 among the common electrodes CTE. Accordingly, the plurality of transmission holes TH may be defined between the plurality of first light-emitting devices LD1 by selectively removing a portion of the common electrode CTE irradiated with the laser LS. In other words, the plurality of transmission holes TH may be defined to be alternately arranged with the plurality of first light-emitting devices LD1 in the first auxiliary display area SDA1. Accordingly, in the process of defining the plurality of transmission holes TH, a damage of the plurality of first light-emitting devices LD1 disposed in the first auxiliary display area SDA1, the pixel defining pattern PDP, and the plurality of insulating layers may be minimized. Accordingly, the reliability of the display panel and the display device including the same may be improved.

Referring to FIG. 15, the encapsulation layer 140 may be formed on the light-emitting device layer 130. In an embodiment, the encapsulation layer 140 may include the first inorganic encapsulation layer 141 disposed on the light-emitting device layer 130, the organic encapsulation layer 142 disposed on the first inorganic encapsulation layer 141, and the second inorganic encapsulation layer 143 disposed on the organic encapsulation layer 142.

Figure 16:
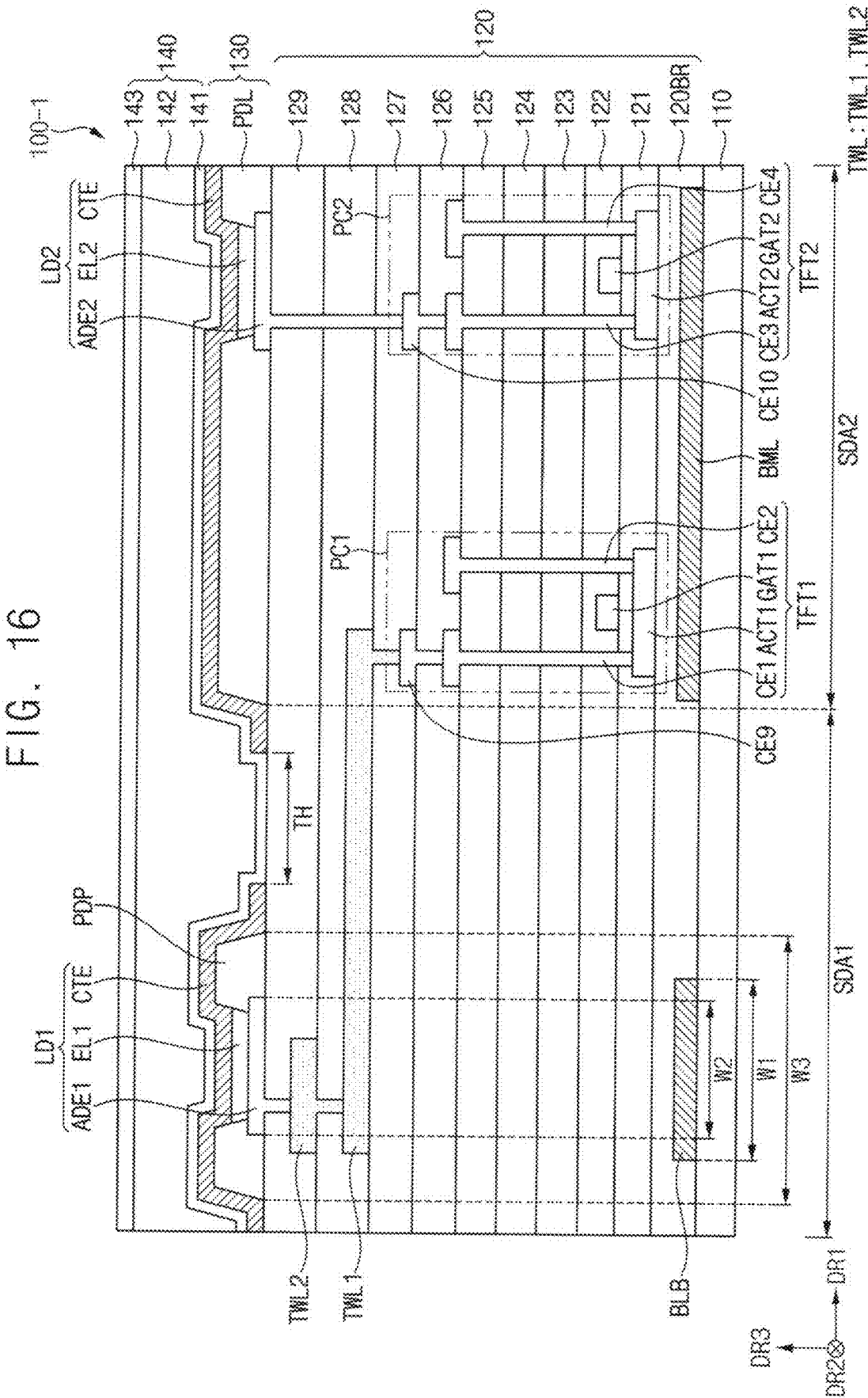
FIG. 16 is a cross-sectional view illustrating an embodiment of a display panel.

FIG. 16 is a cross-sectional view illustrating an embodiment of a display panel.

Referring to FIG. 16, a display panel 100-1 in another embodiment of the disclosure may be substantially the same as the display panel 100 described with reference to FIGS. 2 to 15 except further including a light-blocking pattern BLB.

In an embodiment, as shown in FIG. 16, the light-blocking pattern BLB may be disposed in the first auxiliary display area SDA1 of the display panel 100-1. In an embodiment, the light-blocking pattern BLB may be disposed on the base substrate 110. However, the layer on which the light-blocking pattern BLB is disposed is not necessarily limited thereto, and the light-blocking pattern BLB may be disposed on any one of the plurality of layers between the base substrate 110 and the light-emitting device layer 130. In an embodiment, the light-blocking pattern BLB may be disposed on the buffer layer 120BR, for example. Also, the light-blocking pattern BLB may be disposed on any one of the first to sixth insulating layers 121, 122, 123, 124, 125, and 126. In an embodiment, the light-blocking pattern BLB may be formed through the same process as that of the back metal layer BML.

The light-blocking pattern BLB may overlap the first light-emitting device LD1 in a plan view. Also, the light-blocking pattern BLB may be spaced apart from the plurality of transmission holes TH in a plan view. In an embodiment, in the cross-section, the width W1 of the light-blocking pattern BLB in the first direction DR1 may be larger than the width W2 of the first pixel electrode ADE1 included in the first light-emitting device LD1 in the first direction DR1. Accordingly, the light-blocking pattern BLB may cover the entire lower surface of the first pixel electrode ADE1. In this case, the width W1 of the light-blocking pattern BLB in the first direction DR1 may be narrower than an interval W3 between opposite ends of the pixel defining pattern PDP exposing the first pixel electrode ADE1.

In an embodiment, the light-blocking pattern BLB may include a metal material that absorbs or reflects a laser. In this case, the laser may be an infrared laser. In an embodiment, the light-blocking pattern BLB may include the same material as that of the back metal layer BML, for example. In an embodiment, the material that may be used as the light-blocking pattern BLB may include molybdenum (Mo), titanium (Ti), aluminum (AL), silver (Ag), copper (Gu), or the like. These may be used alone or in combination with each other. Accordingly, in the process for defining the plurality of transmission holes TH, the light-blocking pattern BLB may further minimize a damage of the plurality of first light-emitting devices LD1, the pixel defining pattern PDP and the plurality of insulating layers caused by the laser. Accordingly, the reliability of the display panel and the display device including the same may be further improved.

In an embodiment, a thickness of the light-blocking pattern BLB may be about 50 nanometers (nm) to about 500 nm. When the thickness of the light-blocking pattern BLB satisfies the above range, the damage of the plurality of first light-emitting devices LD1, the pixel defining pattern PDP, and the plurality of insulating layers caused by the laser may be further minimized, while preventing an excessive increase in the thickness of the display panel 100-1.

Figure 17:
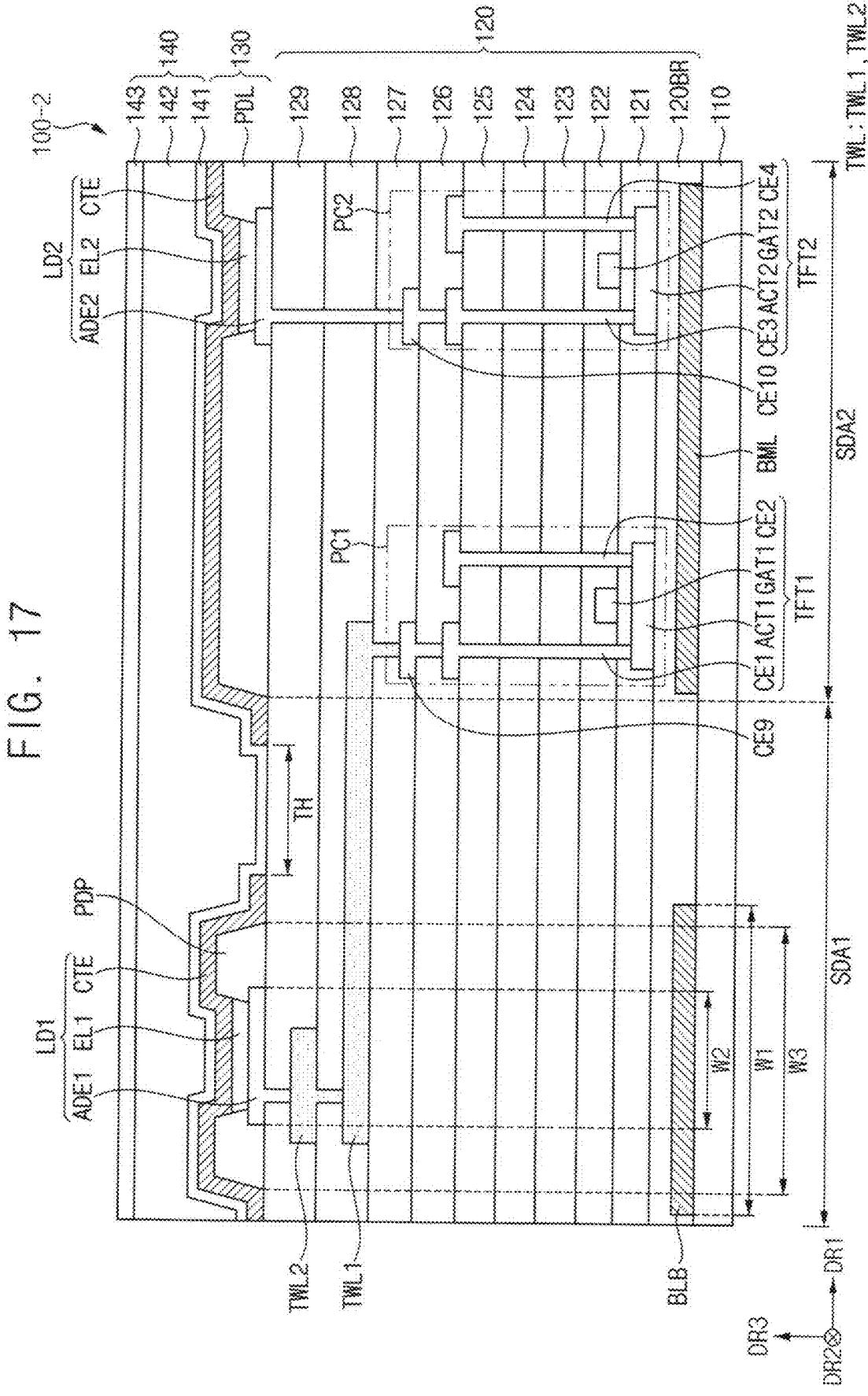
FIG. 17 is a cross-sectional view illustrating an embodiment of a display panel.

FIG. 17 is a cross-sectional view illustrating an embodiment of a display panel.

Referring to FIG. 17, the display panel 100-2 in another embodiment of the disclosure may be substantially the same as the display panel 100-1 described with reference to FIG. 16 except for the width W1 of the light-blocking pattern BLB in the first direction DR1

In an embodiment, the width W1 of the light-blocking pattern BLB in the first direction DR1 may be larger than the interval W3 between opposite ends of the pixel defining pattern PDP exposing the first pixel electrode ADEL. Accordingly, in the process for defining the plurality of transmission holes TH, the light-blocking pattern BLB may further minimize the damage of the pixel defining pattern PDP caused by the laser. However, even in this case, the light-blocking pattern BLB may be spaced apart from the plurality of transmission holes TH in a plan view.

In embodiments, the display device may include the plurality of first light-emitting devices LD1. The plurality of first light-emitting devices LD1 may be disposed in the first auxiliary display area SDA1. In this case, the plurality of transmission holes TH may be defined in the common electrode CTE disposed in the first auxiliary display area SDA1. In the first auxiliary display area SDA1, the plurality of first light-emitting devices LD1 and the plurality of transmission holes TH may be alternately arranged. Accordingly, the transmittance of the first auxiliary display area SDA1 may be improved.

Also, the plurality of transmission holes TH may be defined by selectively removing a portion irradiated with a laser. The laser may be irradiated in the form of dots for each region between the plurality of first light-emitting devices LD1. Accordingly, in the process of defining the plurality of transmission holes TH, the damage of the plurality of first light-emitting devices LD1 disposed in the first auxiliary display area SDA1, the pixel defining pattern PDP, and the plurality of insulating layers may be minimized. Accordingly, the reliability of the display device may be further improved.

The disclosure should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a base substrate including a first auxiliary display area and a main display area surrounding the first auxiliary display area;
a pixel circuit layer disposed on the base substrate; and
a light-emitting device layer disposed on the pixel circuit layer and including a plurality of first light-emitting devices disposed in the first auxiliary display area, each of the plurality of first light-emitting devices including:
a pixel electrode;
a light-emitting layer disposed on the pixel electrode; and
a common electrode disposed on the light-emitting layer and defining a plurality of transmission holes defined in the first auxiliary display area,
wherein the plurality of first light-emitting devices and the plurality of transmission holes are alternately arranged in a plan view, and
at least one of inner surfaces of the common electrode exposed by the plurality of transmission holes includes a plurality of curves.

2. The display device of claim 1, wherein the light-emitting device layer further includes a pixel defining pattern exposing a portion of the pixel electrode, and
wherein the plurality of transmission holes is spaced apart from the pixel defining pattern in the plan view.

3. The display device of claim 2, wherein the plurality of transmission holes is repeatedly arranged along a row direction and a column direction in the plan view.

4. The display device of claim 3, wherein the plurality of transmission holes includes:
a plurality of first transmission holes having a first planar shape; and
a plurality of second transmission holes having a second planar shape different from the first planar shape.

5. The display device of claim 4, wherein the plurality of first transmission holes is repeatedly arranged in odd rows of the first auxiliary display area in the plan view, and the plurality of second transmission holes is arranged in even rows of the first auxiliary display area in the plan view.

6. The display device of claim 1, wherein the base substrate further includes a second auxiliary display area adjacent to the first auxiliary display area, and
wherein the light-emitting device layer further includes a plurality of second light-emitting devices disposed in the second auxiliary display area, and
wherein the pixel circuit layer includes:
a first pixel circuit which is disposed in the second auxiliary display area and controls a current transmitted to at least one of the plurality of first light-emitting devices; and a second pixel circuit which is disposed in the second auxiliary display area and controls a current transmitted to at least one of the plurality of second light-emitting devices.

7. The display device of claim 6, wherein the pixel circuit layer further includes a connection line electrically connecting at least one of the plurality of first light-emitting devices and the first pixel circuit.

8. The display device of claim 7, wherein the connection line includes a transparent conductive oxide.

9. The display device of claim 6, wherein the light-emitting device layer further includes a plurality of third light-emitting devices disposed in the main display area, and wherein the pixel circuit layer is disposed in the main display area and includes a third pixel circuit which controls a current transmitted to at least one of the plurality of third light-emitting devices.

10. The display device of claim 9, wherein a transmittance of the first auxiliary display area is higher than a transmittance of the second auxiliary display area and a transmittance of the main display area.

11. The display device of claim 1, further comprising:
a light-blocking pattern disposed between the base substrate and the light-emitting device layer,
wherein the
light-blocking pattern overlaps the plurality of first light-emitting devices in the plan view.

12. The display device of claim 11, wherein the light-blocking pattern covers an entire lower surface of the pixel electrode included in each of the plurality of first light-emitting devices.

13. The display device of claim 12, wherein the light-blocking pattern is spaced apart from the plurality of transmission holes in the plan view.

14. The display device of claim 11, wherein the light-blocking pattern includes a metal material, and
wherein the metal material absorbs or reflects an incident infrared laser.

15. The display device of claim 11, further comprising:
an electronic module disposed under the base substrate and overlapping the first auxiliary display area on the plan view.

16. A display device comprising:
a base substrate including a first auxiliary display area and a main display area surrounding the first auxiliary display area;
a pixel circuit layer disposed on the base substrate;
a light-emitting device layer disposed on the pixel circuit layer and including a plurality of first light-emitting devices disposed in the first auxiliary display area, each of the plurality of first light-emitting devices including:
a pixel electrode;
a light-emitting layer disposed on the pixel electrode; and
a common electrode disposed on the light-emitting layer and defining a plurality of transmission holes defined in the first auxiliary display area; and
a light-blocking pattern disposed between the base substrate and the light-emitting device layer,
wherein the plurality of first light-emitting devices and the plurality of transmission holes are alternately arranged in a plan view,
the light-blocking pattern overlaps the plurality of first light-emitting devices in the plan view, and
a thickness of the light-blocking pattern is about 50 nanometers to about 500 nanometers.

17. A method of manufacturing a display device, the method comprising:
preparing a base substrate including a first auxiliary display area and a main display area surrounding the first auxiliary display area;
forming a pixel circuit layer on the base substrate;
forming a plurality of first light-emitting devices disposed in the first auxiliary display area on the pixel circuit layer; and
irradiating a laser to the first auxiliary display area from a lower side of the base substrate,
wherein each of the plurality of first light-emitting devices includes:
a pixel electrode;
a light-emitting layer disposed on the pixel electrode; and
a common electrode disposed on the light-emitting layer, and
wherein in the irradiating the laser, a plurality of transmission holes is defined in the common electrode to be alternately arranged with the plurality of first light-emitting devices in a plan view, and
at least one of inner surfaces of the common electrode exposed by the plurality of transmission holes includes a plurality of curves.

18. The method of claim 17, wherein the irradiating the laser is defining the plurality of transmission holes by irradiating the laser in a dot shape.

19. The method of claim 17, further comprising:
forming a light-blocking pattern on the base substrate,
wherein, the light-blocking pattern overlaps the plurality of first light-emitting devices.

* * * * *